United States Patent
Raab et al.

[19]

[11] Patent Number: 5,854,085
[45] Date of Patent: Dec. 29, 1998

[54] MULTI-LAYER TAB TAPE HAVING DISTINCT SIGNAL, POWER AND GROUND PLANES, SEMICONDUCTOR DEVICE ASSEMBLY EMPLOYING SAME, APPARATUS FOR AND METHOD OF ASSEMBLING SAME

[75] Inventors: Kurt Raymond Raab, San Jose; John McCormick, Redwood City, both of Calif.

[73] Assignee: LSI Logic Corporation, Milpitas, Calif.

[21] Appl. No.: 638,898

[22] Filed: Apr. 24, 1996

Related U.S. Application Data

[60] Division of Ser. No. 299,022, Aug. 31, 1994, abandoned, which is a continuation-in-part of Ser. No. 894,031, Jun. 4, 1992, abandoned.

[51] Int. Cl.[6] ................................................. H01L 21/60
[52] U.S. Cl. ........................ 437/211; 437/209; 437/214; 437/217; 437/219
[58] Field of Search ................................. 437/209, 210, 437/211, 212, 213, 214, 215, 216, 217, 218, 219, 220

[56] References Cited

U.S. PATENT DOCUMENTS

| | | |
|---|---|---|
| 4,296,456 | 10/1981 | Reid ........................................ 257/700 |
| 4,771,330 | 9/1988 | Long . |
| 4,800,419 | 1/1989 | Long et al. . |
| 4,842,662 | 6/1989 | Jacobi . |
| 4,933,741 | 6/1990 | Schroeder . |
| 4,965,702 | 10/1990 | Lott et al. . |
| 4,972,253 | 11/1990 | Palino et al. . |
| 5,028,983 | 7/1991 | Bickford et al. . |
| 5,051,813 | 9/1991 | Schneider et al. . |
| 5,220,196 | 6/1993 | Michii et al. ............................ 257/668 |
| 5,409,865 | 4/1995 | Karnezos ................................ 437/210 |

FOREIGN PATENT DOCUMENTS

| | | | |
|---|---|---|---|
| 55-24479 | 2/1980 | Japan ..................................... | 257/666 |

*Primary Examiner*—Kevin Picardat
*Attorney, Agent, or Firm*—Townsend and Townsend and Crew LLP

[57] ABSTRACT

Separate and distinct conductive layers for power and ground are insulated from one another and a patterned signal conductive layer to form a flexible substrate for mounting a semiconductor die in a semiconductor device assembly. TAB technology is utilized to produce an assembly that has superior electrical characteristics because power and ground is conducted on separate low impedance conductive layers. The power and ground leads connecting the semiconductor die and external circuits are selected from the signal trace layer, cut bent downward and attached by bonding to the respective power or ground layer. A tool is disclosed for cutting the selected leads. A method of attaching solder balls to a TBGA film using solder flux and photoimageable solder resist definition is also disclosed.

12 Claims, 21 Drawing Sheets

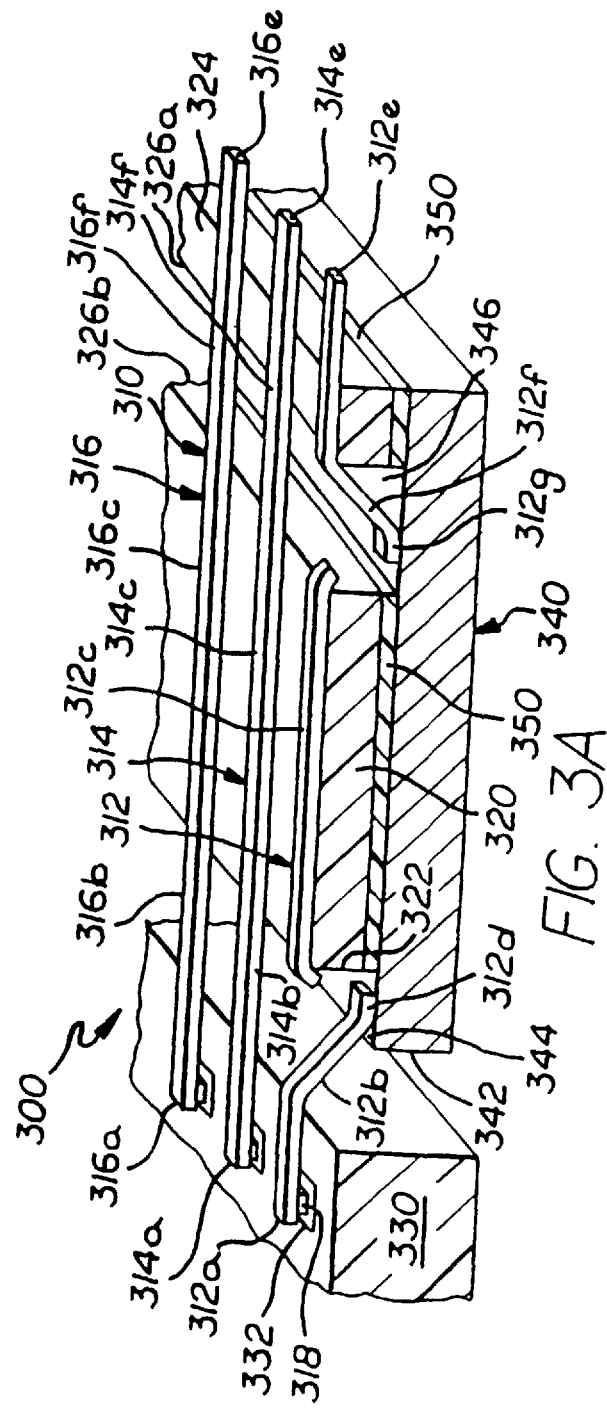

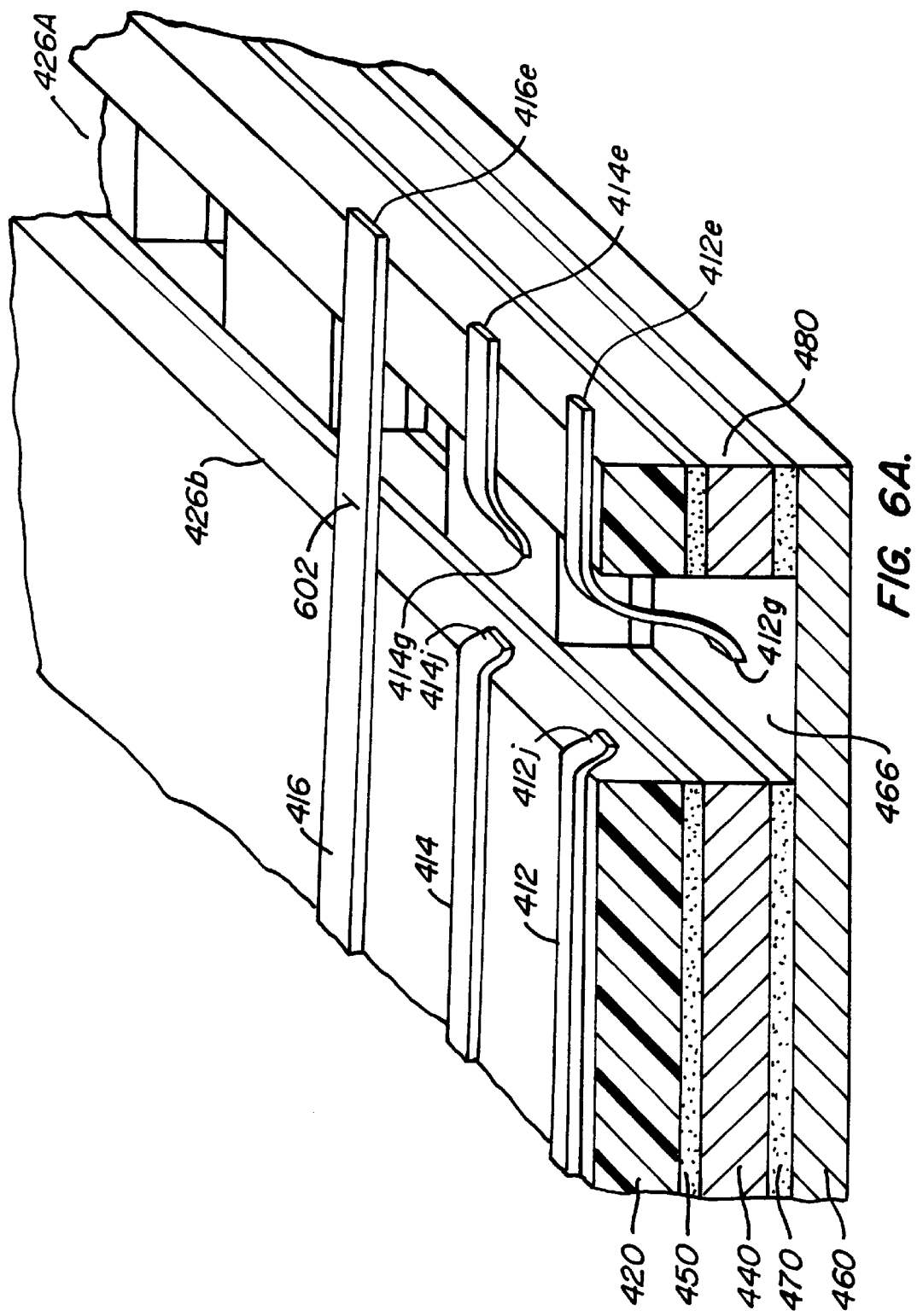

MULTI-LAYER TAB TAPE HAVING DISTINCT SIGNAL, POWER AND GROUND PLANES, SEMICONDUCTOR DEVICE ASSEMBLY EMPLOYING SAME, APPARATUS FOR AND METHOD OF ASSEMBLING SAME

CROSS REFERENCE TO RELATED APPLICATION

This is a Division application Ser. No. 08/299,022, filed Aug. 31, 1994, now abandoned which is a continuation-in-part of application Ser. No. 07/894,031, filed Jun. 4, 1992 (now abandoned).

SPECIFICATION

Background of the Invention

1. Field of Invention

This invention relates to semiconductor device or integrated circuit packaging and, more particularly, to lead frame and flexible lead frame on tape integrated circuit packaging.

2. Discussion of the Related Art

Generally speaking, there are three distinct techniques of packaging a semiconductor device or "die", in any case the semiconductor packages have leads or the like exiting the package for electrically connecting the packaged die to other components, either by mounting directly to a printed circuit board or by plugging the package into a socket which, in turn is mounted to a printed circuit board. These packages are: (1) plastic molded; (2) ceramic package; and (3) flat package.

U.S. Pat. No. 5,015,813 (Schneider, et al.), incorporated by reference herein, illustrates a plastic-packaged semiconductor device. Present plastic packaging techniques involve molding a plastic "body" around a semiconductor die. Prior to molding, the die is attached to a lead frame having a plurality of leads that exit the package and connect the semiconductor device to external circuits, i.e., a printed circuit board system. Plastic packages include DIP (Dual In-line Package), PQFP (Plastic Quad Flat Pack) and PLCC (plastic leaded chip carrier). The lead frame generally is formed from a single thin layer (foil) of conductive material, which is punched or etched to form individual leads. The inner ends of the leads are usually wire bonded to the active side (components, bond pads) of the die. When handling the lead frame, prior to encapsulation, it is exceptionally important to avoid damaging the closely-spaced, delicate leads of the lead frame.

U.S. Pat. No. 4,972,253, incorporated by reference herein, illustrates multi-layer ceramic packages which are laminated structures of alternate conducting and non-conducting layers, formed of thick conductive film and nonconductive ceramic, respectively. Generally, the conductive layers carry signals, power and ground on different layers. This approach, particularly separating the signal plane (layer) from the ground and power planes, has distinct electrical advantages, which are well known to those skilled in the art. In this type of package, the conductive layers are screened or otherwise disposed between the nonconductive ceramic layers, and a very rigid, stable package is thereby formed. For the signal-carrying layers, lead traces are typically screened onto an underlying ceramic layer. A die is placed into an opening in the package and connected to inner (exposed) ends of the lead traces. Generally, there is little problem in damaging the lead traces, since they are well supported by an underlying ceramic layer. Generally, vias are formed in the package to connect power and ground planes to particular leads in the signal plane.

U.S. Pat. No. 4,965,702, incorporated by reference herein, provides another example of a multi-layer package, using polymeric materials for the insulating layers and copper foil for the conductive layers. An object of such a multi-layer package is to provide for an electrical multilayer conductive package which partitions (separates) the power and ground system of the package from the signal transmission system as much as practical in order to optimize the performance of the package.

These two multi-layer ceramic and polymer packages are also known as "chip carriers". Both are preferably completely formed prior to mounting the semiconductor die within an opening in the chip carrier, and in both, the inner leads are well-supported. Hence, both of these chip carriers inherently avoid the problem of lead damage during handling and mounting of the semiconductor die.

FIGS. 1A and 1B illustrate an example of tape-based flat packing. As illustrated herein, a semiconductor device assembly 10 includes an upper, segmented plastic film layer 14 (formed of segments 14A, 14B, 14C and 14D), a lower plastic film layer 16, metallic leads 18 sandwiched between the two plastic layers 14 and 16, a metallic (preferably copper) die attach pad 20 supported between the two plastic layers 14 and 16, a semiconductor device 22 mounted on the die attach pad 20 and bond leads 24 connecting the semiconductor device 22 to the leads 18. It is also known to employ conductive "bumps" on the inner ends of the leads 18, rather than bond wires, to connect the leads to the semiconductor die 22, in a tape automated bonding (TAB) process. The upper and lower plastic layers may be, for example, polyimide and form a thin insulating supportive structure for the leads 18. A square, insulating ring ("body frame" or "dam") 26 may be disposed atop the leads 18 between portions 14B and 14C of the upper plastic film layer, outside the die area. A layer-like quantity of silicone gel 28 is disposed over the die 22 and bond wires 24, and acts as anionic contamination barrier for the die and as a stress relief for the leads 24 during assembly of the semiconductor device assembly, and further prevents an ultimate encapsulation epoxy 30 from contacting the semiconductor die. The inner ends of the leads 18 are very fragile, and extreme care must be exercised when assembling the die 22 to the leads 18. In this respect, tape mounting a semiconductor die requires a similar degree of extreme care when mounting the die to the fine-pitch conductive leads.

Further examples of mounting semiconductor devices to a tape structure are illustrated in U.S. Pat. Nos. 4,800,419 and 4,771,330, incorporated by reference herein.

As used herein, the term "semiconductor device" refers to a silicon chip or die containing circuitry and bond sites on one face, and the term "semiconductor device assembly" refers to the semiconductor chip and associated packaging containing the chip, including external package leads or pins for connecting the semiconductor device assembly to a socket or a circuit board, and including internal connections (such as bond wires, TAB, or the like) of the chip to inner ends of the leads.

The aforementioned patents relate to semiconductor device assemblies having a high lead count, which is "de rigueur" in modern semiconductor devices. The plastic packaging and tape mounting techniques are generally indicative of methods of mounting semiconductor devices to preformed lead frames having a plurality of extremely delicate conductors connected to the die.

As mentioned above, there are generally two techniques for connecting a die to inner ends of lead frame conductors, namely wire bonding and tape-automated bonding (TAB). In TAB, "bumps" typically formed of gold, are located on either the die )"bumped die") or on the inner ends of the lead fingers ("bumped tape"). See, e.g., U.S. Pat. No. 4,842,662, FIGS. 5 and 6, respectively.

U.S. Pat. No. 4,842,662, incorporated by reference herein, illustrates bonding integrated circuit components directly to a TAB tape, without the gold bump, by use of a process employing ultrasonic energy, pressure, time, heat and relative dimensions of the TAB tape. Generally, the end of a lead is "downset" (urged down) onto a die. (See column 6, lines 5–8) This may be though of as a "bumpless" TAB process.

While the above-referenced patents illustrate various techniques of forming lead frames, TAB tapes, and the like, and various techniques for connecting semiconductor dies to same, these techniques generally involve only one layer, or plane, of patterned metal conductors (lead fingers), the single conductive layer comprising a single plane of signals, power and ground to the semiconductor die.

As mentioned hereinabove, it is electrically desirable to provide distinct and separate conductive planes for carrying signal, power and ground from leads (or pins) exiting the package to the die within the package.

U.S. Pat. No. 4,933,741, incorporated by reference herein, illustrates a multilayer package for integrated circuits having a ground plane (20) electrically isolated from a plane of conductors (14) by means of an insulating layer (16) formed of polyimide. The ground plane (20) is connected to selected conductors (14) by means of vias (18) extending through the insulating layer (16). The remaining (non-grounded conductors) carry signals and power to/from the integrated circuit device (11). As disclosed therein,

[b]ecause of the small physical size of the electrical conductors 14, they represent a significant impedance to operating potential and current 15 applied to the integrated circuit 11 causing an undesirable voltage drop along the length of the conductors 14. Additionally, capacitive coupling between the conductors 14 causes cross talk on the conductors 14 which apply signals to and/or derive signals from the integrated circuit 11. Further, the impedance of the conductors 14 create switching noise when the DC operating current 15 applied to the integrated circuit varies.

And, "the capacitive cross coupling between the conductors 14 can be reduced by a [separate] ground plane 20 which also surrounds the integrated circuit 11 and is located adjacent the plurality of conductors." (See, column 2, lines 31–46).

Despite the generally accepted notion that providing a separate ground plane has desirable electrical characteristics, the examples set forth above are limited to rigid, multi-layer ceramic or polyimide or polymer chip carriers. In both of these multi-layer approaches, it is relatively feasible to provide vias between separate metal layers and the intervening insulating layers.

On the other hand, in a tape-mounted, flexible substrate, semiconductor device assembly, it has generally not been very practical to consider or implement incorporating a distinct ground plane, since this type of "flexible" packaging does not lend itself readily to such a multi-layer approach employing vias spanning insulating layers.

For example, commonly-owned, copending U.S. patent application Ser. No. 07/829,977, entitled RIGID BACKPLANE FOR SEMICONDUCTOR DEVICE ASSEMBLY, filed on Jan. 31, 1992, now abandoned, by Michael D. Rostoker, discloses an integrated circuit device package (semiconductor device assembly) having a flexible substrate including an upper patterned insulative layer, and a lower patterned conductive layer including a plurality of package leads (lead fingers). The assembly further includes a rigid or semi-rigid lower protective layer, formed of ceramic, glass, plastic, and combinations thereof, which provides enhanced protection from mechanical and electrical degradation of the packaged device, and which may also serve as a heat sink.

What is needed is a simple, reliable, cost effective, and easy to design and manufacture tape-mounted, flexible substrate semiconductor device assembly having distinct signal, power and ground planes with low signal cross talk and voltage drop.

SUMMARY OF THE INVENTION

It is an object of the present invention to provide an improved semiconductor device assembly.

It is a further object of the present invention to provide a multi-layer, relatively-flexible, tape-like substrate for mounting a semiconductor device, said substrate having at least a signal layer distinct from at least a ground plane.

It is a further object of the present invention to incorporate at least one additional electrically conductive plane into a semiconductor device assembly using tape automated bonding (TAB) assembly techniques.

It is a further object of the present invention to provide a rigid supportive structure in a TAB package.

It is a further object to establish selective and assignable downbond locations for power and ground within TBGA, TAB or COT packages that utilize a more manufacturable downbond process not dependent on lead forming.

It is a further object to reduce the number of TAB-tape conductors/leads which must be routed through a ball grid array, to reduce the overall circuit density, and to improve electrical performance of the semiconductor package.

It is a further object to attach solder balls to a TBGA grid array using solder reflow that is restricted to a defined wettable area for the solder ball collapse to the contact pad.

It is a further object to reduce the overall size of a TBGA package by utilizing the lid/heatsink of the TBGA package as an outer downbond slot and perimeter dam for encapsulant.

It is a further object of the present invention to prevent copper migration and electrical shorting or leakage that may cause semiconductor device malfunction.

It is a further object of the present invention to provide an improved technique for manufacturing a semiconductor device assembly.

It is a further object of the present invention to provide tooling for practicing the inventive techniques disclosed.

According to the invention, a relatively-flexible, tape-like substrate for mounting a semiconductor device has a patterned, conductive layer of fine-pitch leads extending into a central area in which a semiconductor die may be connected to the inner end portions of the leads. The substrate includes an underlying insulating (e.g., plastic film) layer supporting the leads, within the central area there being an opening larger than the area defined by the inner end portions of the leads so that inner end portions of the leads remain exposed past the opening in the insulating layer for the purpose of connecting the leads to the semiconductor device. Preferably, all of the leads are connected to the semiconductor device by tape-automated bonding (TAB).

A second, additional conductive layer on the opposite face of the insulating layer from the patterned conductive layer is not patterned to form distinct leads, but rather forms a planar ring-like layer, the inner edge of which may extend past the opening in the central area of the insulating layer, and is larger than the die. Hence, the substrate can be viewed as a sandwich of two conductive layers, one of which is patterned into discrete conductors (traces), the other of which is not patterned and an insulating layer interposed between these two conductive layers.

According to the invention, a first group (portion) of the total number of lead traces in the patterned conductive layer are connected to the die, preferably by TAB bonding or similar process (i.e., rather than by wire bonding). A remaining, selected portion of the lead traces in the patterned conductive layer are also connected at their inner ends to the die, and are then: (1) broken off at or just within the edge of the central area opening in the insulating layer, leaving an inner end portion of the selected lead traces disconnected from the remaining portion of the selected lead traces, one end of the inner end portion bonded to the die and the other end of the inner end portion being a "free" end, (2) this free end is bent downwards past the insulating layer so that the free ends of the inner end portions of the traces contact an inner edge portion of the additional conductive layer extending into the central area opening of the insulating layer, and (3) the free ends of the conductive traces are bonded to the inner edge portion of the ring. In this manner, the additional conductive layer may act as a ground plane connected to the die.

The additional conductive layer also extends under window-like slots near the outer edges of the insulating layer, where a similar process of cutting, bending and bonding outer portions of the selected lead traces to the additional conductive layer is performed. In this manner, external portions of the selected lead traces, beyond the outer portions, exit the ultimate semiconductor device assembly, and are connected to the external circuit ground (or power).

Hence, the additional conductive layer can be used to conduct ground (or power) from external portions of the selected lead traces to inner end portions of the lead traces, to the die, bypassing, on a different plane, the remaining intermediate portions of the lead traces which are intended (primarily) to carry signals to and from the die. In this manner, a distinct ground (or power) plane is established which is isolated from the patterned conductive layer (primarily signal paths). The beneficial electrical characteristics discussed above are available in a flexible, easily manufactured, tape-mounted semiconductor device assembly.

Further according to the invention, two additional conductive layers are formed, one for ground and one for power. In a manner similar to that set forth with respect to one additional conductive layer, selected leads are cut, bent and connected to the one additional conductive layer, and selected other leads are cut, bent and connected to the second additional conductive layer.

Further according to the invention, the selected and other selected lead traces are cut at an edge of the insulating (plastic) layer between the patterned conductive layer and the first additional (or simply "additional" if only one) conductive layer by urging downward on the selected and selected other lead traces with a cutting tool.

Further according to the invention, the selected lead traces are cut and bonded to the conductive layer with a cutting/ bonding tool that cuts and then bonds the cut selected leads to the conductive layer. In similar fashion, selected other leads may be cut and bonded to an additional conductive layer.

Further according to the invention, various methods of TAB bonding a conductive trace to an additional conductive layer may be utilized, thus avoiding the use of vias.

Further according to the invention, the TAB tape carrier insulating film is patterned having an opening with the conductive lead traces passing thereover. The power plane is patterned with a sub-opening that lines up with the opening of the insulating film. The ground plane/stiffener is continuous and unbroken. The insulating film, power plane and ground plane/stiffener thereby form windows alternating between the power and ground planes. Selected lead traces for power are downbonded within the continuous bounds of the power plane. Selected other lead traces for ground are downbonded within the sub-openings of the power plane to the underlying exposed ground plane/stiffener. Groups of selected and selected other lead traces (conductors) may be sub-grouped and routed accordingly, thus allowing greater space between the endmost lead traces of adjacent windows according to the requirements for the overall pitch, alignment and other manufacturing tolerances.

The insulating carrier film may also have alternating wide and narrow portions forming the elongated slot or opening. The power plane has only a narrow elongated slot, and the ground plane/stiffener is continuous and unbroken. The insulating film, power plane and ground plane/stiffener thereby form a narrow ground plane window and alternating wide portions of the elongated slot allowing access to the power plane. Selected lead traces for power are downbonded within the wide portions of the elongated slot and continuous bounds of the power plane. Selected other lead traces for ground are downbonded within the narrow portion of the elongated slot to the underlying exposed ground plane/ stiffener.

Further according to the invention, the elongated slots for donwbonding selected lead traces may be located just inside the innermost row of ball pads, or within or between the rows of the ball grid array.

Further according to the invention, selected lead traces that will be downbonded are connected to lead traces proximate thereto that are not downbonded. The selected lead traces connect to and terminate at signal lead traces on the insulating film. Both the selected and non-selected lead traces bridge over the elongated downbond slot, however, the selected lead traces to be downbonded do not continue over the insulating film. In this way, the number of TAB-tape conductor/leads which must be routed through the ball grid array is reduced, thus reducing the overall circuit density and improving the electrical performance of the package.

Further according to the invention, attachment of solder balls to the TBGA grid array is enhanced by restricting the solder flow to a predefined solder wettable area when the solder ball collapses to the contact pad during reflow heating. This is accomplished by creating TAB tape pads on the conductor layer for solderably connecting to the solder balls, and defining a desired ball connection area over these pads by application of, for example, patterned photoimageable solder resist developed with a desired dimensional tolerance.

Solder flux may be placed on the ball pad areas of the tape side exposed through the patterned solder resist. The solder flux may be applied by dispensing syringe, screen print, stencil, or other methods known to those skilled in the art. The solder balls are aligned over the ball pad areas of the tape and brought into contact with the previously dispensed solder flux with sufficient force to allow their retention to the pads by the flux. The TBGA tape and flux attached solder balls are then heated to reflow the solder balls sufficiently so as to form a reliable, conformal electromechanical connection.

Further according to the invention, a lid/heatsink is utilized as a downbond conductive plane and perimeter dam for encapsulant. The lid/heatspreader of the present invention forms outer downbond slots outside of the ball grid array. This replaces outer downbond slots that would normally be formed in the TAB tape film. Thus, by eliminating the outer downbond slots the overall package body size may be reduced.

A raised outer rim is formed preferably by stamping during the fabrication of the lid/heatspreader. The height of the heatspreader rim is above the height of the TAB tape lamination and sufficient to restrict the meniscus of encapsulant during cure. The TAB tape is laminated to the lid/heatspreader after the outer edge of what would have been the outermost downbond slot has been excised. The excised perimeter is trimmed short enough to avoid inadvertent shorting of the leads not selected for downbonding to the lid/heatspreader. The selected leads are downbonded to the lid/heatspreader. Encapsulant is placed in the channel between the heatspreader rim and TAB tape so as to cover the selected downbonded and nonselected leads, then the encapsulate is cured.

Further according to the invention, the selected lead is cut a short distance, preferably about 2 to 5 mils, from the edge of the downbond slot in the insulating layer. During formation of the selected cut-lead for connection to the conductive layer heatspreader, the short end of the selected cut-lead is urged downward into the slot. During subsequent slot encapsulation, both the free short end and the downbond-selected cut-lead that is connected to the downbond conductive plane are covered with encapsulant. This encapsulant helps prevent copper migration and the possibility of electrical shorting or leakage of the leads that may cause semiconductor device failure.

Further according to the invention, a bonding tool for cutting the selected conductive lead traces and TAB bonding the cut lead traces to an additional conductive layer is disclosed. This bonding tool helps to ensure the location of the lead break and to provide optimum lead bonding to the conductive substrate. The bonding tool of the present invention has a cutting tip with a sharp front radius that causes the lead to break at the point of contact of the front radius of the tool.

Other objects, features and advantages of the invention will become apparent in light of the following description thereof.

BRIEF DESCRIPTION OF THE DRAWINGS

FIG. 3A is a perspective view, partially in cross-section, of a multi-layer flexible substrate mounting a semiconductor die, with one additional conductive layer, according to the present invention;

FIG. 6A is a perspective view, partially in cross-section, of a multi-layer flexible substrate illustrating the positioning of cut leads according to the present invention;

DETAILED DESCRIPTION OF THE INVENTION

Figure 1A:
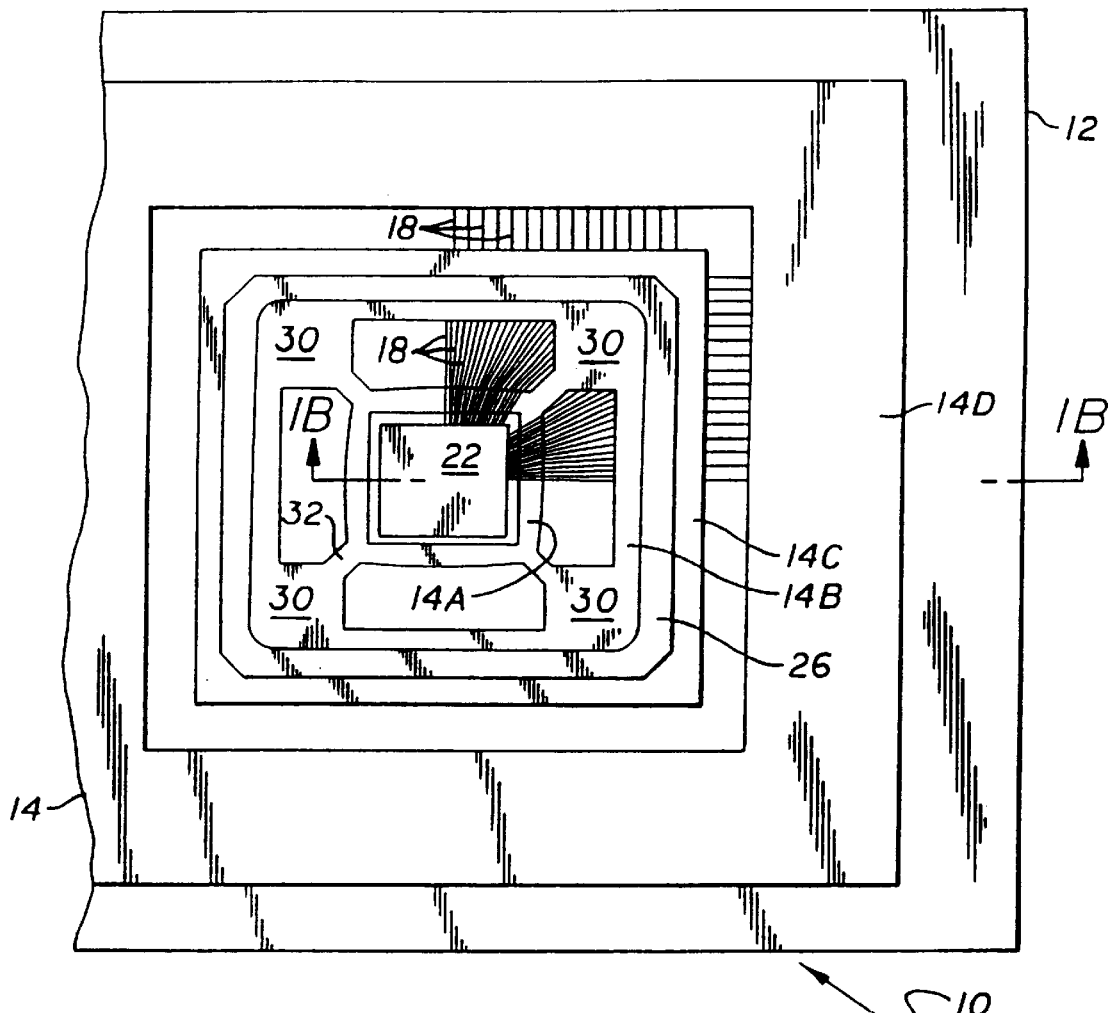
FIG. 1A is a plan view of a prior art technique of tape-mounting a semiconductor device to a flexible substrate.
Figure 1B:
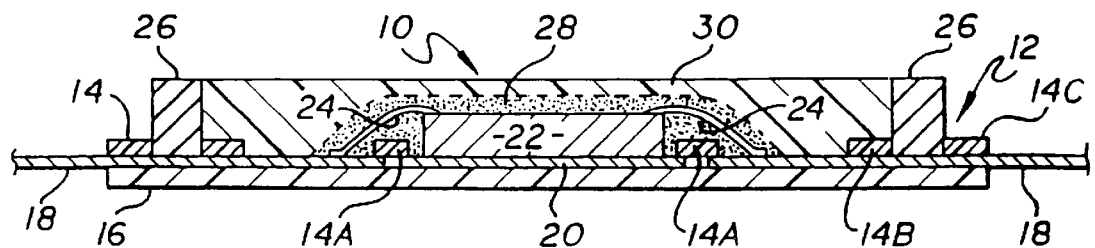
FIG. 1B is a cross-sectional view of the prior art technique of FIG. 1A, taken on a line 1B—1B through FIG. 1A.

FIGS. 1A and 1B illustrate a prior art technique of tape-mounting a semiconductor device to a flexible substrate. As discussed above, a semiconductor die can be wire bonded, or TAB mounted to the inner ends of the conductive leads (traces).

Figure 2A:
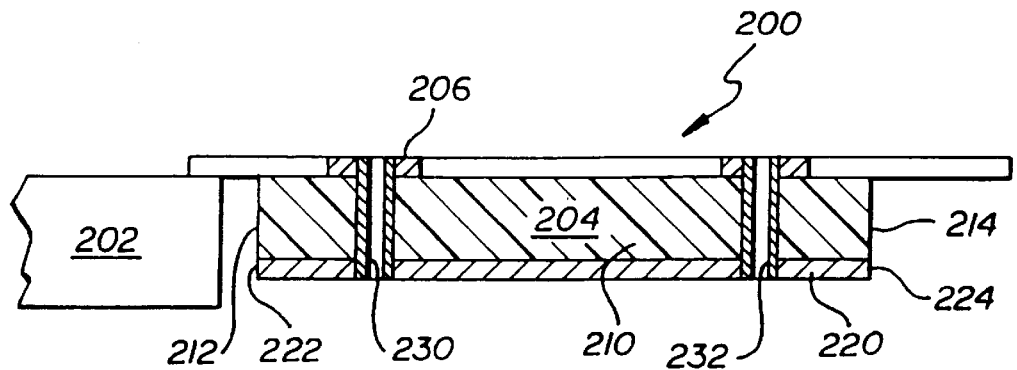
FIG. 2A is a cross-sectional view of a prior art technique of forming a two-metal-layer, TAB-type semiconductor device assembly, using vias to connect the two metal layers together.
Figure 2B:
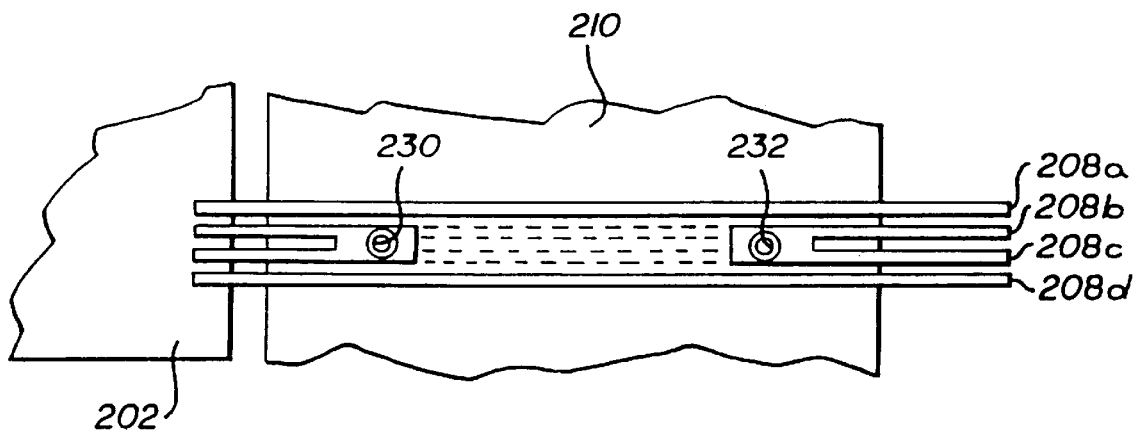
FIG. 2B is a top plan view of a portion of the assembly of FIG. 2A.

FIGS. 2A and 2B illustrate another prior art technique 200 of tape-mounting a semiconductor die 202 to a flexible substrate 204. In this example, the substrate has first metal layer 206, such as copper foil, patterned with conductive lines (traces) 208. These traces 208 are very fine pitch to meet the signal input-output (I/O) demands of modern, complex semiconductor devices. Only four traces 208a, 208b, 208c and 208d are illustrated (see FIG. 2B), as representative of the hundreds of such traces typically required. These traces 208 extend from an outer end (right, as viewed in the Figures) where they will connect to external sources and circuitry, to an inner end (left, as illustrated) where they are bonded to the die, and usually each trace (e.g., 208a, 208b, 208c and 208d) carries a distinct I/O signal, power or ground.

As is well known in the art, the first metal layer 206 of traces 208 is suitably supported by an underlying layer 210 of an insulating material, such as polyimide film. The insulating layer 210 is provided with a central opening 212, formed by an inner peripheral edge thereof. The first metal layer traces 208 extend into the opening 212, a suitable distance for bonding to the die. The first metal layer traces 208 also extend beyond the outer edge 214 of the insulating layer for connection to external circuits and systems.

The substrate 204 is also provided with a second metal layer 220, on an opposite side of the insulating layer 210 from the first metal layer 206. The second metal layer 220 is not patterned to form traces, but is rather a planar ring-like structure having an inner edge 222 aligned with the inner edge 212 of the insulating layer 210, and an outer edge 224 aligned with the outer edge 214 of the insulating layer.

In this semiconductor device assembly 200, the lower conductive layer 220 is intended to be a ground plane. In order to effect this function, vias 230 are formed near the inner edge 222 of the lower conductive layer 220, which vias 230 extend through the layer 220, through the layer 210, and through the layer 206, and the vias are usually plated through so that individual traces 208 may be electrically connected to the ground plane 220 near the semiconductor device 202. However, as is readily apparent from FIG. 2B, in order to accommodate the vias 230, which are on the order of 0.004 inches (100 um) in diameter, it is necessary to dedicate two adjacent conductive traces, in this case the traces 208b and 208c to making the connection to the ground plane. Because of the modern drive to very high lead count packages, the individual traces 208 are preferably on the order of 0.002 inches (50 um) wide and spaced at a 0.002 pitch. And, as is readily illustrated in FIG. 2B, this requires that the two conductive traces 208b and 208c are tied together in the area of the via, and hence cannot carry two separate signals. This, of course, wastes valuable traces (leads 208), in an environment where the number of distinct traces carrying distinct signals is a major design criteria.

In a similar manner, vias 232 are formed near the outer edge 224 of the lower conductive layer 220, wherein vias 232 extend through the layer 220, through the layer 210, and through the layer 206. Again, it will typically require at least two adjacent traces (e.g., 208b, 208c) to accommodate such a via, due to via size restrictions. Nevertheless, the ground plane 220 can be connected to conductive lines 208b and 208c near the outer edge 214 of the insulating layer 210. In this manner, using vias 230 near the inner edge 212 of the insulating layer 210 and using vias 232 near the outer edge 214 of the insulating layer 210, a ground connection can be made to an external lead (right hand portion of the leads 208), connected by the via 232 to another plane 220, and brought back up to the original layer 206 near the die 202. Electrical benefits will accrue by virtue of the low impedance separate ground plane 220.

FIG. 2B also illustrates that intermediate portions of the traces 208b and 208c are preferably excised (or simply not formed), and these intermediate portions of the traces 208b and 208c are depicted by dashed lines. This ensures that the electrical path from one end of the leads 208b and 208c to the other ends thereof is largely in the second, offset (from the first 206) and parallel with the plane 220.

Hence, the technique 200 is illustrative of prior art techniques of forming a two-metal-layer, TAB-type semiconductor device assembly, using vias to connect the two metal layers together. This is commonly called "two metal layer TAB tape". As discussed above, using vias to connect one plane to another will unavoidably reduce the number of distinct leads available for inputting and outputting signals to/from the die.

A further problem with two metal layer TAB tape is that the bottom layer 220 is a thin foil, much like the top layer 206 (but not patterned into traces). Hence, the bottom layer 220 does not provide significant additional mechanical support for the substrate 204, nor does the bottom layer 220 provide much in the way of enhanced thermal performance. Further, even if the intermediate portions (dashed lines, FIG. 2B) of the conductors 208b and 208c are removed, there is still a significant portion of these conductors in the signal layer 206, therefore allowing parallel paths for ground. Further each tape (substrate) design is specific to a particular application, i.e., must be customized for the particular "pin-outs" of a particular semiconductor device. (The term "pin-outs" is used to indicate which bond site on the die is used for signals, which is used for power and which is used for ground. Pin-outs typically vary widely from device to device.) Further, the manufacture of such two metal layer TAB tapes is relatively expensive (i.e., as compared with the inventive techniques disclosed below).

MULTI-LAYER FLEXIBLE SUBSTRATE HAVING A SECOND CONDUCTIVE PLANE

According to the present invention a flexible substrate, such as a tab tape, is provided with a first conductive layer having patterned lines (traces) primarily for carrying signals to and from the semiconductor die, and is provided with a second conductive layer for providing power and/or ground connections on a plane offset from and insulated from the first conductive layer. Inasmuch as the first conductive layer carries all of the signals (versus power and ground), it is sometimes referred to herein as a "signal layer." The layer 206 of FIGS. 2A and 2B is such a signal layer. The flexible TAB tape substrate, a semiconductor device assembly employing same, tools for manufacturing same, and methods of manufacturing same are disclosed herein.

FIG. 3A illustrates a relevant portion of a semiconductor device assembly 300, partially assembled (not encapsulated or lidded), employing the inventive technique of breaking, bending and bonding selected leads to a second conductive layer using a TAB process.

A first conductive layer 310 is patterned to have a plurality of fine-pitch conductive leads (traces) 312, 314, and 316 (only three of what may be hundreds of these leads are depicted for illustrative clarity). The first conductive layer 310 is supported by an underlying insulating layer 320. The first conductive layer 310 may be formed of a thin copper foil, on the order of one mil thick. The insulative layer 320 may be formed of a thin plastic layer, such as polyimide, on the order of five mils thick. This is standard for TAB tape semiconductor device assembly fabrication.

The polyimide layer 320 has a central opening formed by its inner peripheral edge 322, and the opening is sufficiently large to accommodate a semiconductor die 330. This central opening may be preferably about 0.3 to 1.5 millimeter (mm) on a side larger than the die 330.

Inner ends 312a, 314a and 316a of the leads 312, 314 and 316, respectively, are each TAB bonded with bumps 318, preferably gold bumps, to "bond sites" 332 on the top circuit-containing surface (circuits not illustrated) of the die 330. This is a well known procedure. The bumps may be on the leads, on the die, or the inner ends of the leads may be TAB bonded to the die without using bumps (See U.S. Pat. No. 4,842,662).

Inner end portions 312b, 314b and 316b of the leads 312, 314 and 316, respectively, span the gap between the outer edge of the die 330 and the inner edge 322 of the polyimide layer 320. As indicated above, the distance between the die and the inner edge 322 of the polyimide layer 320 is approximately 1.0 mm. Generally, this is according to established TAB procedures.

As will be seen, the inner end portion of selected leads, in this example the lead 312 are broken and bent downward past the polyimide layer 320 to contact a second conductive plane. This is a marked departure from established TAB procedures.

Intermediate portions 312C, 314C and 316C or the leads 312, 314 and 316, respectively, are supported by the polyimide layer 320. This is according to established TAB procedures.

According to the present invention, a second conductive layer 340 is attached to the underside of the polyimide layer 320 (opposite the first conductive layer 310) using a suitable adhesive 350, such as a 2 mil thick layer of epoxy. The second conductive layer 340 is formed as a square, relatively (vis-a-vis the layer 310) rigid ring, having an inner peripheral edge 342 forming an opening slightly (on the order of 0.5 mm) smaller than the opening formed by the inner edge 322 in the polyimide layer 320, and slightly (on the order of 0.5 mm) larger than the die 330. Hence, an inner edge portion 344 of the second conductive layer 340 is exposed within the opening formed by the inner edge 322 in the polyimide layer 320, on the order of 0.5 mm all around the inner edge 322 of the polyimide layer 320.

According to the invention, the inner end portion 312b of the selected leads 312 is severed (cut) at the inner edge 322 of the polyimide layer 320. Hence, the inner end portion 312b has one end 312a bonded to the die 330, and another "free" end 312d. The free end 312d is bent downward, past the polyimide layer 320, and using a TAB bonding technique, either with or without bumps (U.S. Pat. No. 4,842,662 illustrates bonding without bumps), or other suitable TAB bonding technique, the free end 312d of the selected lead 312 is bonded to the exposed inner edge portion 344 of the second conductive layer 340. In this manner, a connection is made from selected bond sites 332 on the die, via the very short inner end portions 312b of the selected traces 312, to a second conductive layer 340 which is discrete and offset from the first conductive (signal) layer 310.

In a similar manner, the selected leads 312 are connected to an outer edge portion 346 of the second conductive layer 340, as follows. The polyimide layer 320 has an outer edge 324. The leads 312, 314, and 316 extend beyond this edge 324 a suitable distance for allowing connection of the outer ends 312e, 314e and 316e of the leads 312, 314 and 316, respectively, to external systems and components, such as on a printed circuit board, or via the intermediary of a socket. Slightly, on the order of 1.0 mm within the outer edge 324 (i.e., within the four outer edges) of the polyimide layer 320, there is provided an elongated slot 326 through the polyimide layer, paralleling the respective outer edge 324. The slot 326 has an outer edge 326a and an inner edge 326b, and is on the order of 0.5 mm wide (width determined from outer edge 326a to inner edge 326b).

The second conductive layer 340 extends outward beyond and underneath the slot 326, so that the outer edge portion 346 of the second conductive layer 340 is exposed within a "window" formed by the slot 326.

Outer end portions 312f, 314f and 316f of the leads 312, 314 and 316, respectively, span the slot 326. The outer end portion 312f of selected leads 312 (one illustrated) are severed (cut) at the inner edge 326b of the slot 326. Hence, the outer end portion 312f has one end 312e extending beyond the outer edge 324 of the polyimide layer 320, and partially supported thereby (by the portion of the polyimide layer between the slot and the outer edge of the polyimide layer), and another "free" end 312g. The free end 312g is bent downward, through the slot 326, past the polyimide layer 320, and using a TAB bonding technique such as is disclosed in the aforementioned U.S. Pat. No. 4,842,662, or other suitable TAB bonding technique, the free end 312g is bonded to the exposed portion 346 of the second conductive layer 340, in a manner similar to the bonding of the free inner end 312d to the exposed inner edge portion 344 of the second conductive layer 340. In this manner, a connection is made from selected outer lead ends 312e which are external to the semiconductor device assembly, via relatively short outer end portions 312f, to the second conductive layer 340.

Figure 3B:
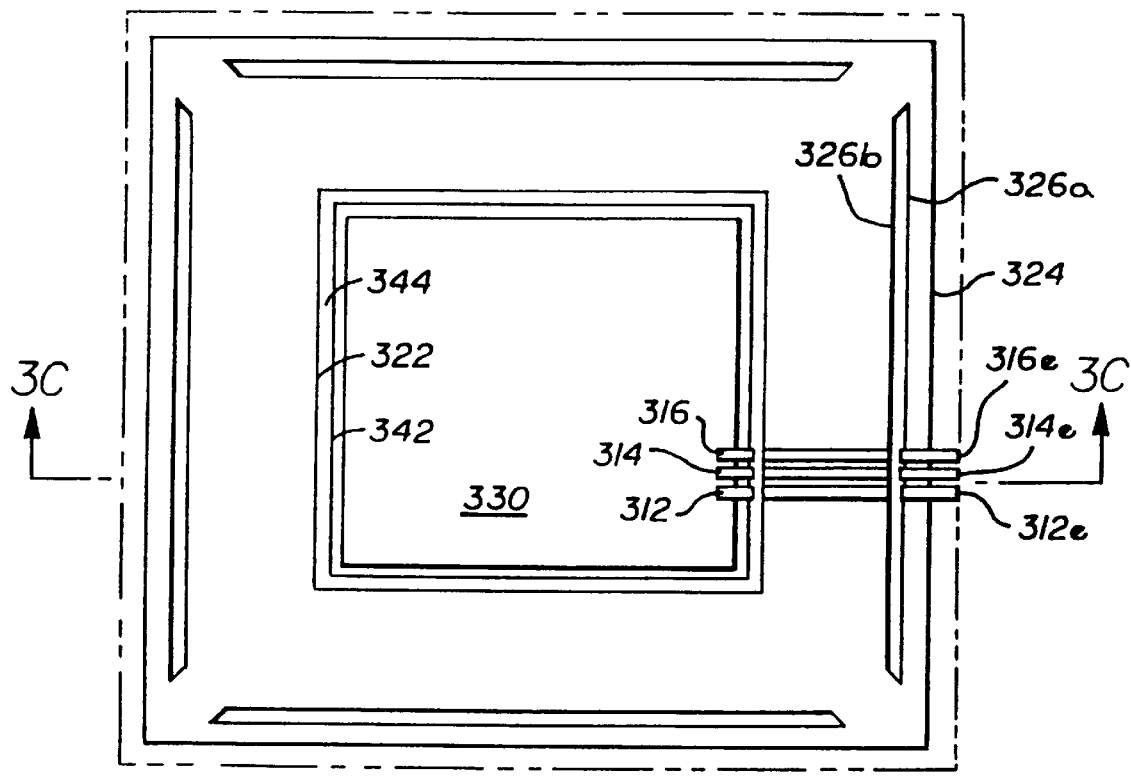
FIG. 3B is a top plan view of a semiconductor device assembly formed according to the technique of FIG. 3A.
Figure 3C:
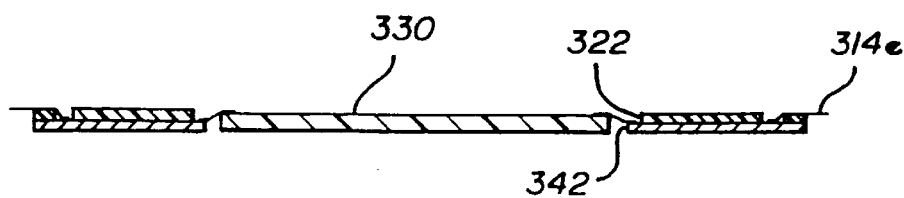
FIG. 3C is a cross-sectional view of the semiconductor device assembly of FIG. 3B.

FIGS. 3B and 3C illustrate more complete views of the entire semiconductor device assembly 300 than is illustrated in FIG. 3A. However, only three leads 312, 314, and 316 are depicted for clarity. The polyimide layer 320 is formed as a square ring. As mentioned hereinbefore, the polyimide layer 320 is provided with a central opening formed by its inner peripheral edge 322, which opening 322 may be preferably about 0.3 to 1.5 millimeter (mm) on a side larger than the die 330. The inner edge portion 344 of the second conductive layer 340, which is also formed as a square ring, extends from under the polyimide layer 320 to about midway between the inner edge 322 of the polyimide layer and the outer periphery of the die 330.

The "second conductive plane" established by the second conductive layer 340 provides either ground or power from external ground or power sources to the die, while the first conductive layer having individual lead traces is employed preferably for signals entering and exiting the semiconductor device from external sources. Preferably, the second conductive plane is connected to ground, for the electrical benefits that will accrue, as discussed hereinabove.

The second conductive layer may be used for all ground connections to the die. Ground connections typically number about 10 to 20 percent of the total number of leads, or about 40 to 80 leads (e.g., 312) out of about 400 total leads (312 plus 314 plus 316) on the TAB tape substrate. In addition, another about 10 to 20 percent of the total number of leads, or about 40 to 80 leads (non-ground) leads in the signal layer (310) may be suitably employed for power, leaving the majority of the leads available for signals.

Hence, as illustrated in FIGS. 3A–3C, a separate, second conductive plane is established for ground (or power) connections to a semiconductor device, and the second conductive plane is offset and insulated from a first conductive plane having signal traces. Significantly (considering an area defined by the polyimide, within the slots 326), there are no trace (e.g., 312) or portions thereof (namely 312c) providing a ground (or power) connection for the semiconductor device. In other words, in the first conductive plane (e.g., 310) the conductive traces carry only signals (and power) to and from the semiconductor device, and none of the intermediate portions (312c) of the traces are connected to ground (or power)—i.e., there are no "parallel" paths in the signal layer as there are in the two metal layer TAB tape illustrated in FIGS. 2A and 2B.

By way of definition, the term "substrate" is used to refer to the assembled layers 310, 320 and 340. The term "partial substrate" is used to refer to only some of those layers.

Preferably, the epoxy layer 350 does not extend completely to the edges 322 and 326b of the polyimide layer, but may be recessed about 0.05 mm inward of those edges.

In FIG. 3A, it is evident that the inner and outer ends of the intermediate portions 312c may become "stretched" over the respective polyimide edges 322 and 326b when the respective inner and outer end portions 312b and 312f of the traces 312 are cut and bent downward. It is evident from FIG. 3A, that the inner end portions 312b are connected to the inner edge portion 344 of the second conductive layer in an "opposite" orientation than the outer end portions 312f are connected to the outer edge portion 346. However, in both cases, the free ends 312d and 312g are oriented towards each other and towards the disconnected intermediate portions 312c underneath which the second conductive layer 340 is disposed.

Although discussed in greater detail hereinbelow, it is important to note that the present technique differs from that disclosed in the aforementioned U.S. Pat. No. 4,842,662 in at least one very significant way. Generally, in the aforementioned patent, an already free end of a lead (24) is simply "downset" and bonded to a die (10). In the present invention, free ends (312d and 312g) are created by the action of forcing the lead down past the respective edge (322 and 326b) of the polyimide layer 320. In other words, the selected leads 312 are cut along their length in order to create the free ends 312d and 312g. These free ends 312d and 312g are not the "normal" free end 312a that the aforementioned patent is intending to bond to a die.

The preferred sequence of assembly is:

(a) provide a tape (partial substrate) having only signal traces (e.g., the first conductive layer 310) and the plastic support layer (e.g., the polyimide layer 320);

(b) locate the die (330) in the central opening (formed by edges 322) in the plastic support layer;

(c) connect the die to the inner ends of the signal traces (e.g., 312 and 314) using a TAB process (either bumped or bumpless);

(d) affix a second conductive plane (e.g., 340), having a smaller central opening (formed by inner edge 342) than the central opening in the plastic support layer, using a suitable adhesive (350), to the plastic support layer opposite the first conductive layer, so that an inner edge portion (344) of the second conductive layer is exposed in the opening of the plastic support layer;

(e) break, bend and bond free ends (312d) of inner end portions (312b) of selected traces (312) to the exposed inner edge portion (344) of the second conductive layer;

(f) break, bend and bond free ends (312g) of outer end portions (312f) of the same selected traces to an outer edge portion (346) of the second conductive layer exposed by a slot (326) near the outer edge of the plastic support layer; and (g) complete assembly of the semiconductor device assembly using normal TAB process flow, i.e., encapsulating the die, etc.

Steps (e) and (f) are preferably performed with a thermosonic TAB bonding process, discussed hereinbelow. However, such bonding may be bumpless, or may be reflow or thermo compression bonding, or may employ bumps. Reflow bonding usually involves tin-on-tape, and gold bumps. Thermo compression bonding usually employs gold bumps, combined with force and high temperature.

The advantages of the present inventive technique over the two metal layer TAB tape (FIGS. 2A and 2B) include reduced cost, design flexibility, added mechanical support for the substrate and the finished semiconductor device assembly, no limitations on inner lead via hole pitches (compare FIG. 2B), better electrical performance by avoiding parallel ground paths, and better thermal performance.

Regarding design flexibility, it is evident that a "generic" TAB tape can be formed for a variety of semiconductor devices with various "pin-outs" (which pins are designated for signal, power and ground), and then (later) certain leads (312) can be selected for connection to the second (ground) plane. This is not possible with the two-metal-layer TAB tape of FIGS. 2A and 2B, which must be customized for each semiconductor device having a different pin-out.

Further, with the addition of a second electrically unique plane into a TAB package, the semiconductor device assembly will have better electrical performance, the ratio of input/output connections versus ground connections will be reduced, and mechanical support will be added to a relatively flexible package. Obtaining these advantages at the relatively low cost afforded by the present inventive technique makes for a very attractive semiconductor packaging technique.

The second conductive layer 340 can be made of any electrically conductive material. The thickness of the second conductive layer can range from very thin, on the order of one mil, to very thick, on the order of one inch. In any case, it is evident that the thickness of the second conductive layer 340 can be established as thick as desired, to provide additional support for the substrate and to provide enhanced thermal characteristics for the substrate, much more so than the second conductive foil layer employed in the two-metal-layer TAB tape illustrated in FIGS. 2A and 2B.

MULTI-LAYER FLEXIBLE SUBSTRATE HAVING SECOND AND THIRD CONDUCTIVE PLANES

FIGS. 2A and 2B illustrated a prior art technique of "two-metal-layer tab tape," wherein an additional (second) foil layer was added and connected by vias through an insulating layer to the first, patterned, conductor layer. The disadvantages and limitations of such a technique have been discussed above.

It is also known to those skilled in the art of semiconductor device fabrication to provide a "three-metal-layer TAB tape" by adding yet another foil layer to the two-metal-layer TAB tape. Evidently, this will create the need for yet more vias, thereby even more significantly reducing the number of lead traces available for signals, and will suffer from the same limitations and disadvantages, discussed above, that apply to two-metal-layer TAB tape.

According to the present invention, a second and a third conductive layer are added to a TAB substrate, for carrying ground and power, so that the power and ground currents are isolated from the first signal layer. The disclosed technique is similar in many regards to that disclosed with respect to FIGS. 3A–3C.

Figure 4A:
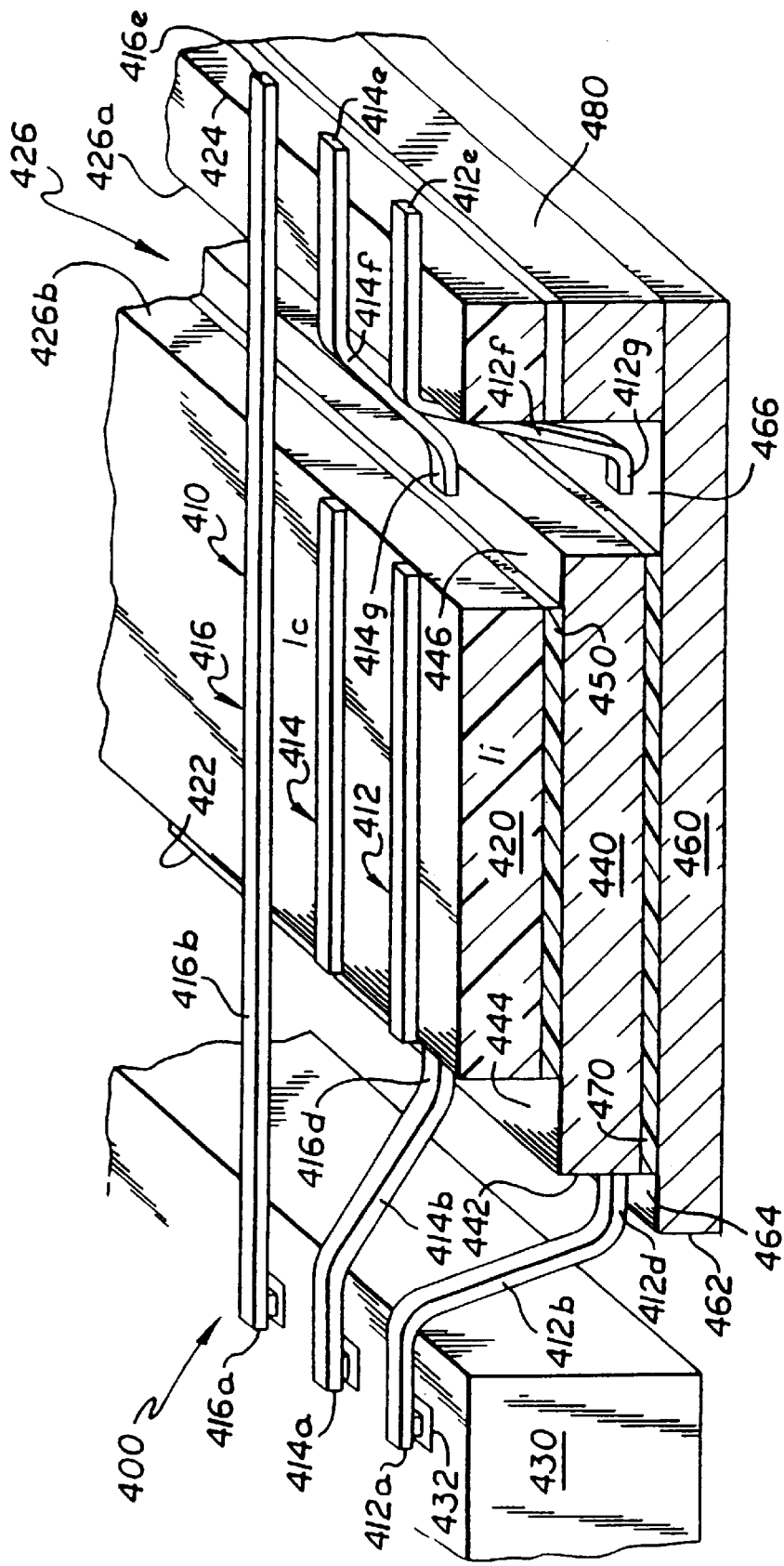
FIG. 4A is a perspective view, partially in cross-section, of a multi-layer flexible substrate mounting a semiconductor die, with two additional conductive layers, according to the present invention.
Figure 4B:
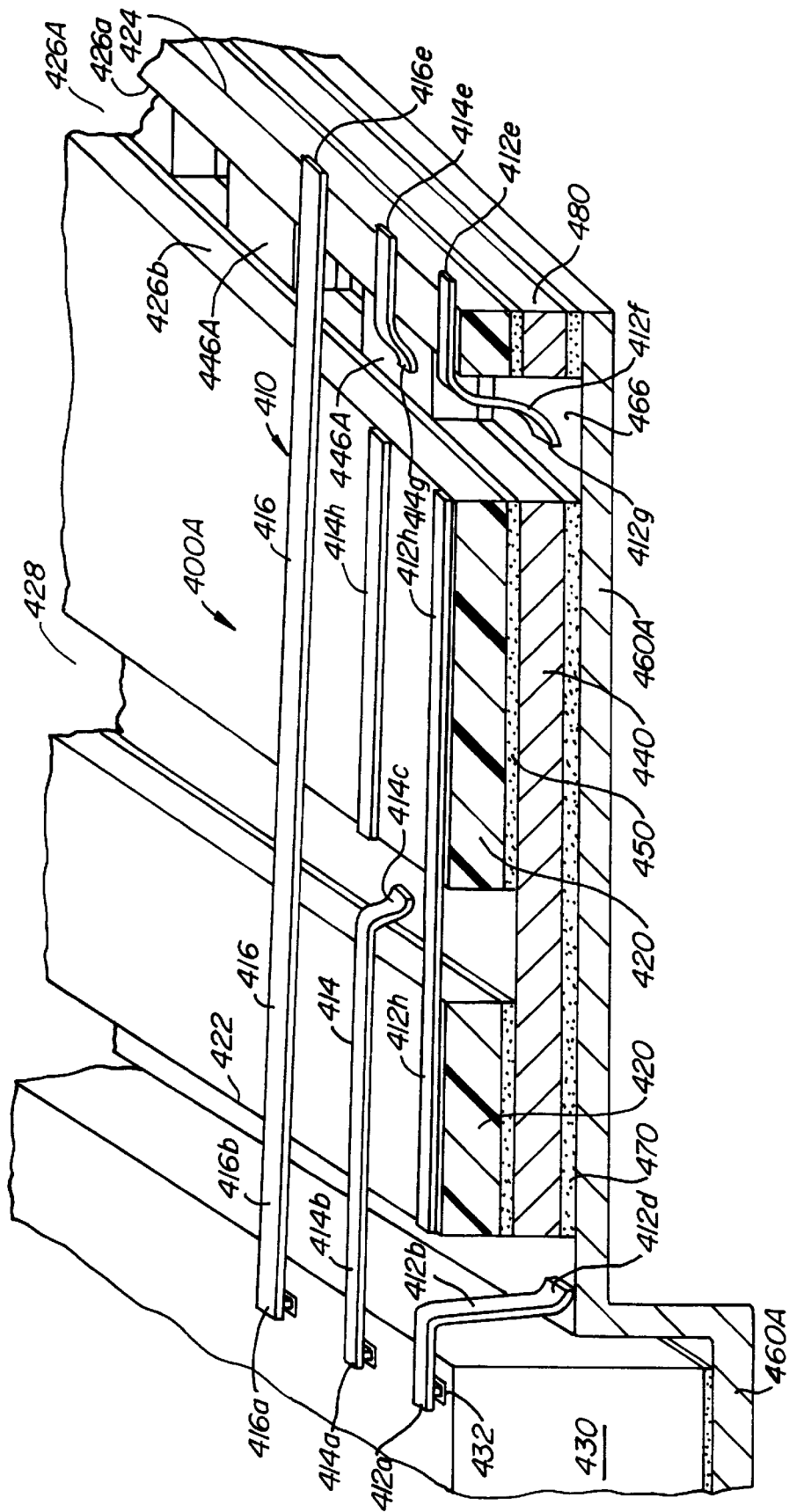
FIG. 4B is a perspective view, partially in cross-section, of a multi-layer flexible substrate having three conductive layers that additionally mounts a semiconductor die to the third conductive layer, according to the present invention.

FIGS. 4A and 4B illustrate relevant portions of semiconductor device assemblies 400 and 400A, respectively, partially assembled (not encapsulated or lidded) and employing the inventive technique of breaking, bending and bonding selected and other selected leads to second and third conductive layers, respectively, using a TAB process. It will be appreciated, from the description that follows, that selected and other selected leads may be bent and bonded to one additional conductive layer, and may be connected by vias to another conductive layer. However, using vias is contrary to the general purpose of the present invention, which is to efficiently utilize all of the conductive traces without having to sacrifice lead traces (e.g., FIGS. 2B) for the purpose of connecting power or ground.

A first conductive layer 410 is patterned to have a plurality of fine-pitch conductive leads (traces) 412, 414 and 416 (only three are illustrated for clarity). The first conductive layer 410 is supported by an underlying insulating layer 420. The first conductive layer 410 may be formed of a thin copper foil, on the order of one mil thick. The insulative layer 420 may be formed of a thin plastic layer, such as polyimide, preferably 3 to 5 mils thick.

The polyimide layer 420 has a central opening formed by its inner peripheral edge 422, and the opening is sufficiently large to accommodate a semiconductor die 430. The opening 422 is larger than the die 430. Generally as illustrated in FIG. 4A, the opening formed by the inner edge 422 of the polyimide layer 420 must be twice as large as the corresponding opening 322 of the FIG. 3A embodiment. In FIG. 4B, the opening formed by the inner edge 422 may be the same size as the opening 322 since only one level of bonding is contemplated in the central opening.

Inner ends 412a, 414a and 416a of the leads 412, 414 and 416, respectively, are each connected to "bond sites" 432 on the top of the die 430, preferably using bumped or bumpless TAB techniques. Inner end portions 412b, 414b and 416b of the leads 412, 414 and 416, respectively, span the gap between the outer edge of the die 430 and the inner edge 422 of the polyimide layer 420.

Referring to FIG. 4A, the inner end portions of selected leads, in this example the leads 412 and 414 are broken and bent downward past the polyimide layer 420 to contact second and third conductive planes, respectively, in the central opening (FIG. 4A). Referring to FIG. 4B, only leads 412 are broken and bent downward past the polyimide layer 420 to contact the third conductive (ground) plane/heatspreader 460A. The embodiment illustrated in FIG. 4B allows a smaller central opening than that of FIG. 4A.

The lead pitch (spacing of the leads) is smallest at the die 430. Therefore, when only selected other leads 412b (ground) are downbonded to the ground plane 460A, which is also in electrical communication with the substrate of the die 430, there is less risk of the selected leads 414b (power) shorting to an edge of the die 430. A downbond slot 428 positionally biased toward the edge 422 of the insulating layer 420 may be utilized to downbond selected leads 414c to the second conductive plane (power) 440. Intermediate portions 412h, 414h and 416h of the leads 412, 414 and 416, respectively, are supported by the polyimide layer 420 but are not connected.

According to the invention, a second conductive layer 440 is affixed to the underside of the polyimide layer 420 (opposite the first conductive layer 410) using a suitable adhesive 450, such as a layer of epoxy. The second conductive layer 440 is formed as a square, relatively (vis-a-vis the layer 410) rigid ring, having an inner peripheral edge 442 forming an opening slightly (on the order of 0.5 mm) smaller than the opening formed by the inner edge 422 in the polyimide layer 420 (FIG. 4A). Hence, an inner edge portion 444 of the second conductive layer 440 is exposed within the opening formed by the inner edge 422 in the polyimide layer 420.

According to the invention, the inner end portion 414b of the selected lead 414 is severed (cut) at the inner edge 422 of the polyimide layer 420. Hence, the inner end portion 414b has one end 414a bonded to the die 430, and another "free" end 414d. The free end 414d is bent downward, past the polyimide layer 420 and, preferably using a bumpless TAB bonding technique, the free end 414d of the selected lead 414 is bonded to the exposed inner edge portion 444 of the second conductive layer 440. In this manner, a connection is made from selected bond sites 432 on the die, via the very short inner end portions 414b of selected traces 414, to a second conductive layer 440 which is discrete and offset from the first conductive (signal) layer 410. This is similar to the second conductive plane 340 of FIG. 3A.

In this embodiment 400, a third conductive plane 460 is provided beneath the second conductive plane 440, and is electrically isolated therefrom by an insulating layer 470. The insulating layer is preferably a polyimide layer, but can be an adhesive (e.g., epoxy). In practice, a sub-assembly comprising the second conductive layer 440, the insulating layer 470 and the third conductive layer 460 may be formed separately from the remainder of the substrate (i.e., the layers 410 and 420), and then bonded thereto with the adhesive 450. Ultimately, as will become evident, the second conductive layer can be used for connecting power from an external source to the die, and the third conductive layer 460 can be used for connecting the die to ground. In this manner, the layers 440 and 460, separated by the insulating layer 470 form a built-in (within the ultimate packaged semiconductor device assembly) bypass capacitor for the power and ground connections, which has numerous electrical advantages readily apparent to those skilled in the art. To this end, the layer 470 can be selected from materials of having suitable dielectric constant and thickness to establish a desired built-in capacitance.

The third conductive layer 460 is preferably formed of metal, preferably by stamping, and may be thicker than a foil for the purpose of forming a substantially ridged assembly. The third conductive layer 460 may have a central opening defined by its inner edge 462 which is on the order of 0.5 mm smaller than the opening formed by the edge of the second conductive layer 440. In this manner, an inner edge portion 464 of the third conductive layer 460 is exposed within the openings in both the polyimide layer 420 and the second conductive layer 440 (FIG. 4A). The layers 420 and 440 (FIG. 4B) may also have the same size central openings. In the assembly 400A, illustrated in FIG. 4B, the downbond slot 428 is utilized to downbond the leads 414c to the second conductive plane 440.

According to the invention, the inner end portion 412b of a selected lead 412 is severed (cut) at the inner edge 422 of the polyimide layer 420. Hence, the inner end portion 412b has one end 412a bonded to the die 430, and another "free" end 412d. The free end 412d is bent downward, past the polyimide layer 420 and, preferably using a bumpless TAB bonding technique, the free end 412d of the selected lead 412 is bonded to the exposed inner edge portion 464 of the third conductive layer 460. The die 430 bond sites 432 may be connected by the selected traces 412b to a third layer 460. The third layer 460 is a discrete conductive plane offset from both the first conductive (signal) layer 410 and the second conductive layer 440 (FIG. 4A). The die 430 bond sites 432 may also be connected by selected leads 414d to the second layer 440 at the surface 444 (FIG. 4A) or, alternatively, by selected leads 414c downbonded in slot 428 (FIG. 4B).

Evidently, to implement the breaking and bending down of the leads (412 and 414) to the two additional levels (460 and 440, respectively) it is important that the inner end portions of the leads being bent downward to the third conductive layer 460 be sufficiently long to reach same. Particular dimensions will depend upon particular applications, especially upon the thickness of the layers between the leads of the first conductive plane and the second or third conductive plane that is being downbonded thereto.

In the manner set forth above, it is taught how selected leads connected to the die can be cut, bent and connected to two additional conductive planes (layers), especially for making power and ground connections. In a manner similar to that illustrated in FIG. 3A, the outer ends of the selected leads are also connected to the outer edge portions of the additional two conductive planes.

The selected leads 414 are connected to an outer edge portion 446 of the second conductive layer 440, as follows. The polyimide layer 420 has an outer edge 424. The leads 412, 414 and 416 extend beyond this edge 424 a suitable distance for allowing connection of the outer ends 412e, 414e and 416e of the leads 412, 414 and 416, respectively, to external systems and components, such as on a printed circuit board, or via the intermediary of a socket.

Proximate to the outer edge 424 (i.e., within the four outer edges) of the polyimide layer 420, there is an elongated slot 426 through the polyimide layer, paralleling the respective edge 424. The slot 426 (FIG. 4A) has an outer edge 426a and an inner edge 426b, and may be, for example, 1.0 mm wide (twice the width of the slot 326, FIG. 3A).

The second conductive layer 440 extends outward partially, such as by at least 0.5 mm, underneath the slot 426, so that the outer edge portion 446 of the second conductive layer 440 is exposed within a "window" formed by the slot 426 (FIG. 4A). Outer end portions 412f, 414f and 416f of the leads 412, 414 and 416, respectively, span the slot 426.

The outer end portion 414f of selected leads 414 (one illustrated) are severed (cut) at the inner edge 426b of the slot 426. Hence, the outer end portion 414f has one end 414e extending beyond the outer edge 424 of the polyimide layer 420, and partially supported thereby (by the portion of the polyimide layer between the slot and the outer edge of the polyimide layer), and another "free" end 414g. The free end 412g is bent downward, through the slot 426, past the polyimide layer 420, and is bonded to the inner exposed (through the slot 426) edge 446 of the second conductive layer 440. In this manner, a connection is made from selected outer lead ends 414e which are external to the semiconductor device assembly, via relatively short outer end portions 414f, to the second conductive layer 440.

In contrast to the structure of FIG. 3A, wherein the second conductive layer 340 extended fully past the slot 326, in this embodiment 400, the second conductive layer 440 extends only partially (e.g., halfway) into the slot area. As will be hereinafter discussed, the remaining half of the slot area is required for connecting to an exposed (through the slot 426) outer edge portion 466 of the third conductive layer 460.

The outer end portion 412f of selected leads 412 (one illustrated) are severed (cut) at the inner edge 426b of the slot 426. Hence, the outer end portion 412f has one end 412e extending beyond the outer edge 424 of the polyimide layer 420, and partially supported thereby (by the portion of the polyimide layer between the slot and the outer edge of the polyimide layer), and another "free" end 412g. The free end 412g is bent downward, through the slot 426, past the polyimide layer 420, past the second conductive layer 440, and is bonded to the inner exposed (through the slot 426) portion 466 of the third conductive layer 460. In this manner, a connection is made from selected outer lead ends 412e which are external to the semiconductor device assembly, via relatively short outer end portions 412f, to the third conductive layer 460.

Whereas in FIG. 3A, the second conductive layer 340 extended to the outer edge of the polyimide layer 320, to the edge 324 thereof, we have seen that in this embodiment 400 such is not feasible since it is desired to leave space past the second conductive layer 440 for access to the third conductive layer 460. Hence, as illustrated in FIG. 4A, a suitable spacer block 480 is between the top surface of the third conductive layer 460 and the lower surface of the polyimide layer 420, in an unsupported area of the polyimide layer 420 between its outer edge 424 and the edge 426a of the slot 426. The spacer block 480 can be formed as a separate element, and bonded with the epoxy 450 to the underside of the polyimide layer 420, or it may be a continuation of the layers 420, 450 and 440.

In the example illustrated in FIG. 4A, the ends of the intermediate portions of the cut and bent conductors 412 and 414 are illustrated not stretched over the respective edges 422 and 426b of the polyimide layer for clarity. However, it is desirable to partially stretch and bend the conductors 412 and 414 over the edge 426b as more fully described hereinafter.

Figure 4C:
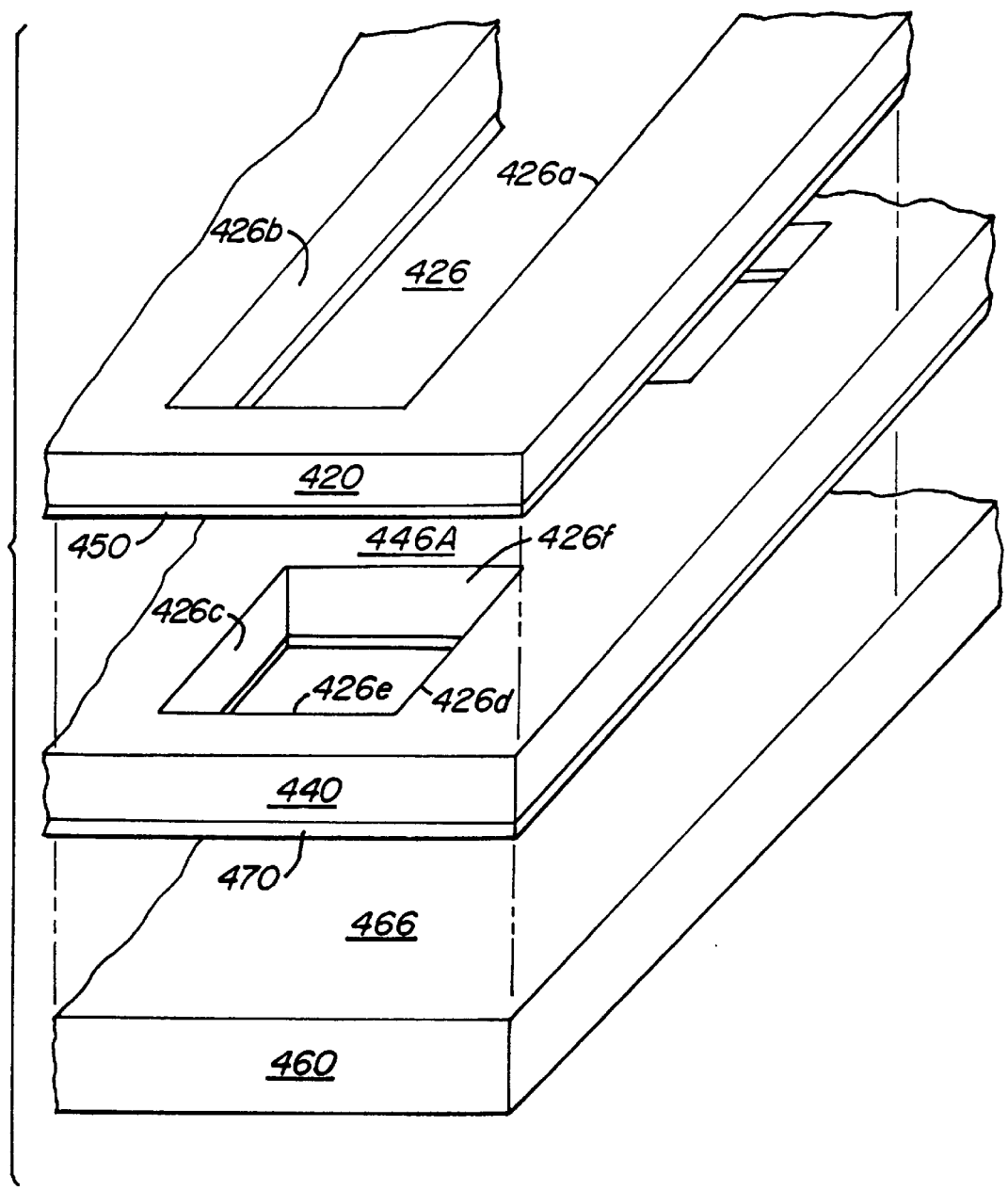
FIG. 4C is perspective exploded view of a partial section of the substrate illustrated in FIG. 4B.
Figure 4D:
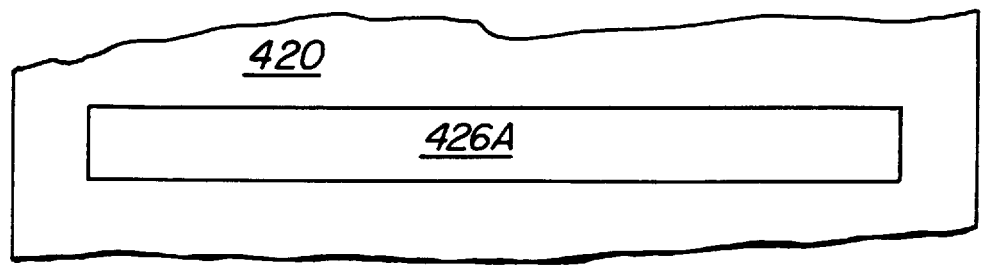
FIG. 4D is a plan view of the substrate layers illustrated in FIGS. 4B and 4C.
Figure 4D:
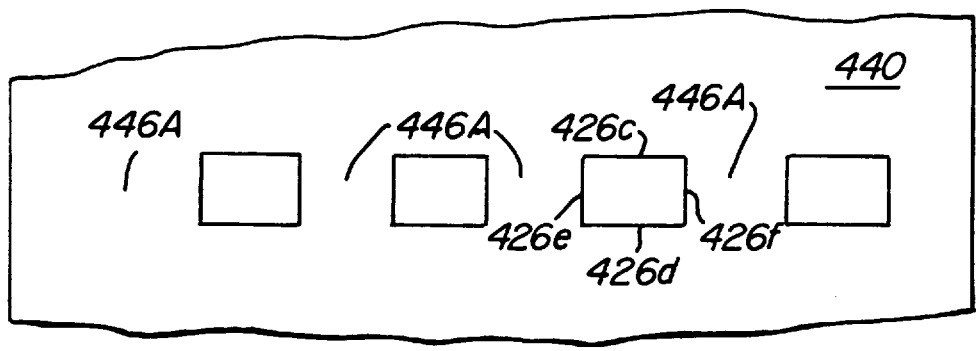
Figure 4D:
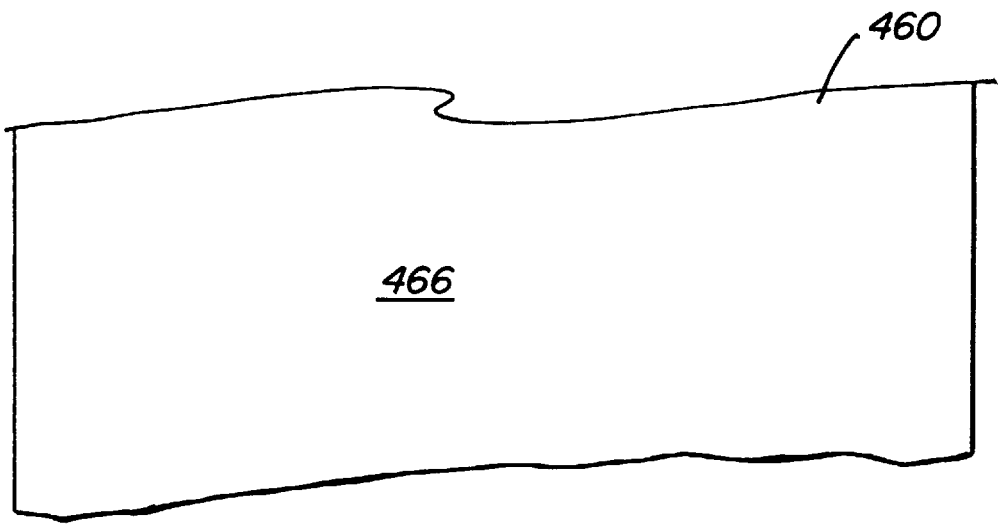

Referring to FIGS. 4B–4D, another embodiment of the present invention is illustrated. Contiguous subgroups of leads may be predefined and adapted for downbonding to either the ground or power planes of tape ball grid array ("TBGA") or chip tape heat sink ("CTHS") packages. This embodiment of the present invention utilizes pre-established assignments of downbond locations for ground and power within the TBGA, TAB, or chip on tape ("COT") packages. This allows a more easily manufactured downbond process that is not so dependent on lead forming.

In FIG. 4B, the insulating layer 420 is formed with an elongated slot 426A having an outer elongated edge 426a and an inner elongated edge 426b. The slot 426 forms a window as more clearly illustrated in FIG. 4D. The second conductive layer 440 has a plurality of subwindows defined by edges 426c, 426d, 426e and 426f. These subwindows are arranged in an elongated row that match the elongated slot 426A in the insulating layer 420 (FIG. 4D)

Layers 420, 440 and 460 may be laminated together with insulating adhesives 450 and 470. The adhesives 450 and 470 insulate the conductive layers 440 and 460, respectively, as more fully described above. When the layers 420, 440 and 460 are assembled, they form a first elongated slot 426 A through the insulating layer 420, alternating subwindows having ground surfaces 466 and power surfaces 446A. The subgroups of leads 412 are downbonded to the ground surface 466. The subgroup of leads 414 are downbonded to the power surface 466A.

An advantage of the embodiment of FIGS. 4B–4D is that a simpler downbonding process is achieved because forming of the leads 412 and 414 is not as critical as those of FIG. 4A. Shorting of the downbonded lead 412 and 414 to undesired conductive layers (440 or 460) is substantially eliminated compared to the embodiment of FIG. 4A. In addition, the slot 426A of FIG. 4B may be narrower in width than the slot 426 of FIG. 4A (similar to the width of slot 326 of FIG. 3A). Groups of conductors are designated to fall within respective power (surface 466A) or ground (surface 466) subwindows and be bonded thereto. This allows greater spacing between the endmost conductors of adjacent subwindows in accordance with the demands of the overall pitch, alignment and other manufacturing tolerances required.

Figure 4E:
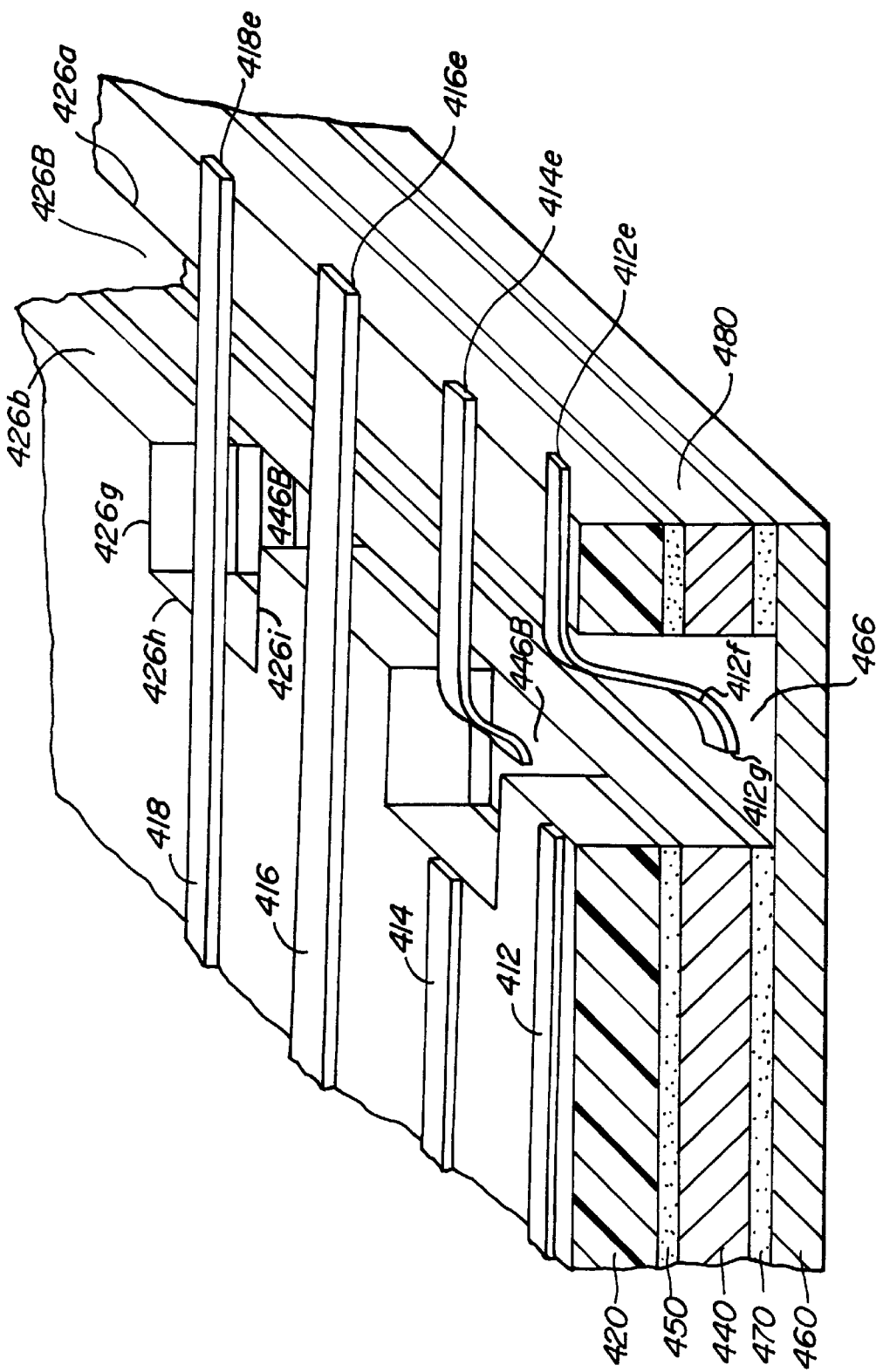
FIG. 4E is a perspective view, partially in cross-section, of yet another multi-layer flexible substrate mounting a semiconductor die, with two additional conductive layers, according to the present invention.
Figure 4F:
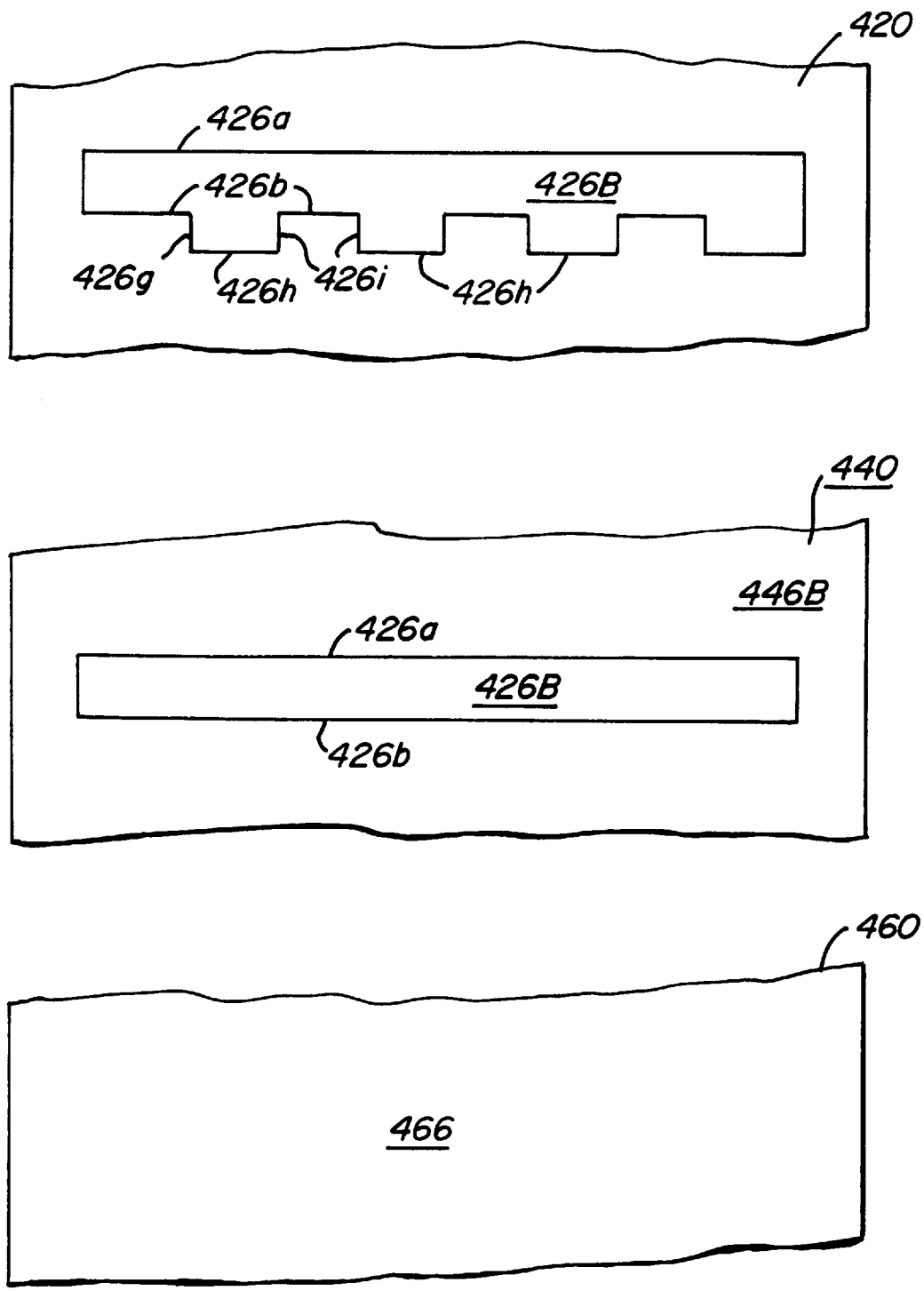
FIG. 4F is a plan view of the substrate layers illustrated in FIG. 4E.

Still another embodiment of the present invention is illustrated in FIGS. 4E and 4F. Subgroups of leads are again defined by having alternate downbonding to the ground and power planes of the TBGA or CTHS packages.

The insulating layer 420 is formed with an elongated slot 426B having alternating narrow and wider portions. An outer elongated edge 426a is on the side of the slot 426B toward the outer ends 412e, 414e, 416e and 418e of leads 412, 414, 416 and 418, respectively. An inner edge comprises alternating narrow (426b) and wide (426h) portions. The wide portions are formed as subwindows having three sides 426g, 426h and 426i. These subwindows are opposite the outer elongated edge 426a and form the wide portions of the slot 426B.

Layers 420, 440 and 460 are laminated together with insulating adhesives 450 and 470. The adhesives 450 and 470 insulate the conductive layers 440 and 460, respectively, as more fully described above. When the layer 420, 440 and 460 are together, they form an elongated slot 426 through the insulating layer 420 having alternating wide and narrow portions giving access to the power surfaces 466B and ground surfaces 446, respectively. The subgroups of leads 412 are downbonded to the ground surface 466. The subgroup of leads 414 are downbonded to the power surface 466B.

An advantage of the embodiment of FIGS. 4E and 4F is that there is superior alignment of the leads with the downbond groups and the bonding of even adjacent ground and power leads to their respective planes may be accomplished in as small as a 250 micrometer pitch.

The preferred sequence of assembling the TAB tape having two additional layers (440 and 460) is:

(a) provide a tape (partial substrate) having only signal traces (e.g., the first conductive layer 410) and the plastic support layer (e.g., the polyimide layer 420);

(b) locate the die (330) in the central opening (formed by edges 422) in the plastic support layer;

(c) connect the die to the inner ends of the signal traces (e.g., 412 and 414);

(d) sub-assembly the second and third conductive layers (440 and 460) together, including an insulating layer (470) therebetween, and a spacer element (480) if required;

(e) affix the sub-assembly (440, 470, 460, 480) to the plastic support layer opposite the first conductive layer, using a suitable adhesive (450);

(f) break, bend and bond free ends (414d) of inner end portions (414b) of selected traces (414) to the exposed inner edge portion (444) of the second conductive layer (440), and break, bend and bond free ends (412d) of inner end portions (412b) of selected other traces (412) to the exposed inner edge portion (464) of the third conductive layer (460);

(g) break, bend and bond free ends (414g and 412g) of outer end portions of the same selected and selected other traces (414 and 412) to outer edge portions (446 and 466) of the second and third conductive layers (440 and 460), through a slot (426) near the outer edge of the plastic support layer; and (h) complete assembly of the semiconductor device assembly using normal TAB process flow, i.e., encapsulating the die, etc.

Steps (f) and (g) are preferably performed with a thermosonic TAB bonding process, discussed hereinbelow. However, such bonding may be bumpless or may employ bumps.

In any of the embodiments described herein, it is clearly possible that the conductors are bonded to the die and to the additional (second and third) conductive layers using bumps, solder balls, or the like, rather than a bumpless TAB process. Nevertheless, the inventive concept of cutting, bending and bonding to underlying additional conductive layers is entirely applicable to non-TAB flexible substrates, however they may be formed.

REDUCED CIRCUIT DENSITY LEAD DESIGN FOR DEBUS BY DOWNBOND METHOD

Figure 5A:
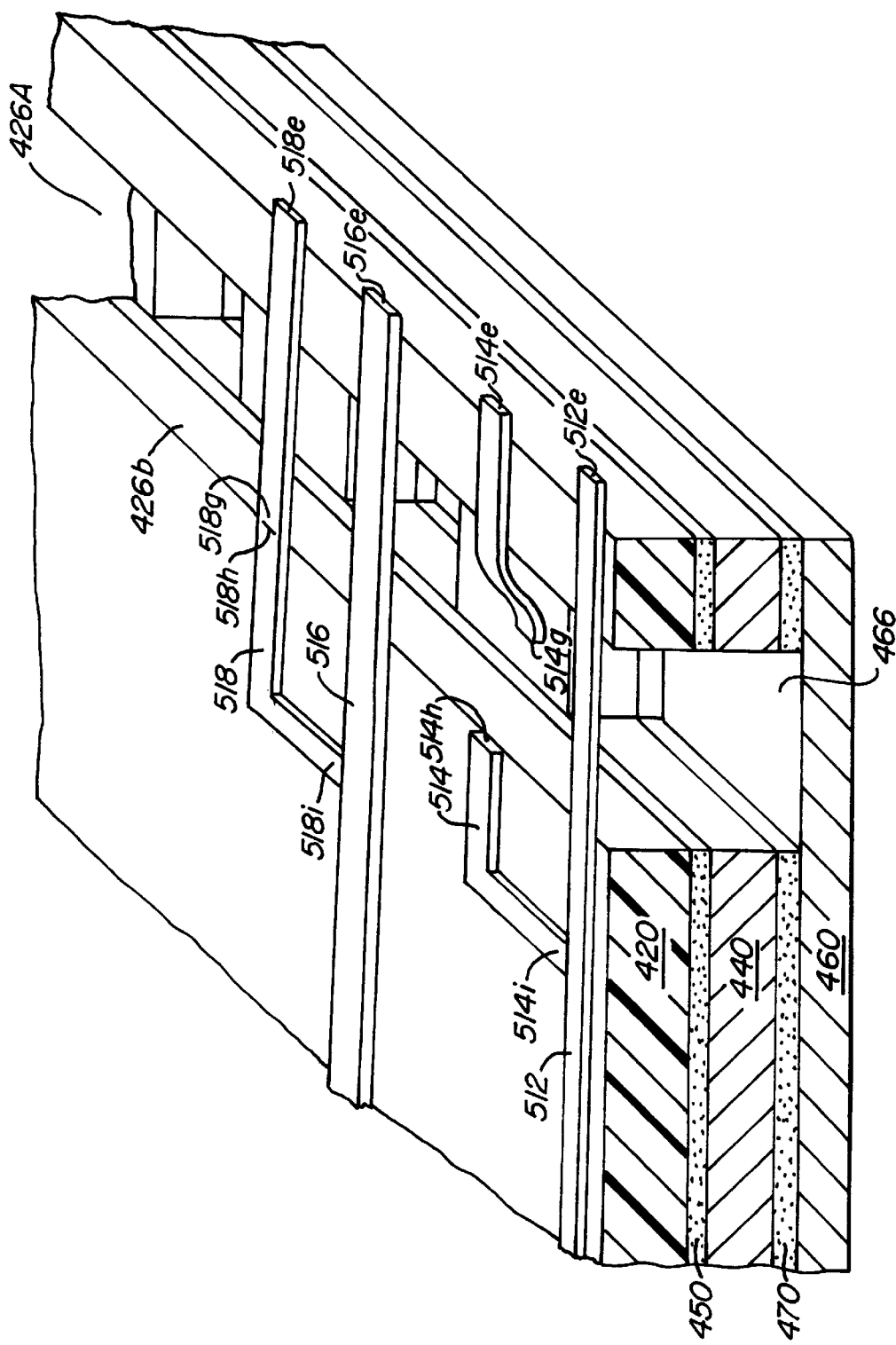
FIG. 5A is a perspective view, partially in cross-section, of a multi-layer flexible substrate having reduced numbers of leads.
Figure 5B:
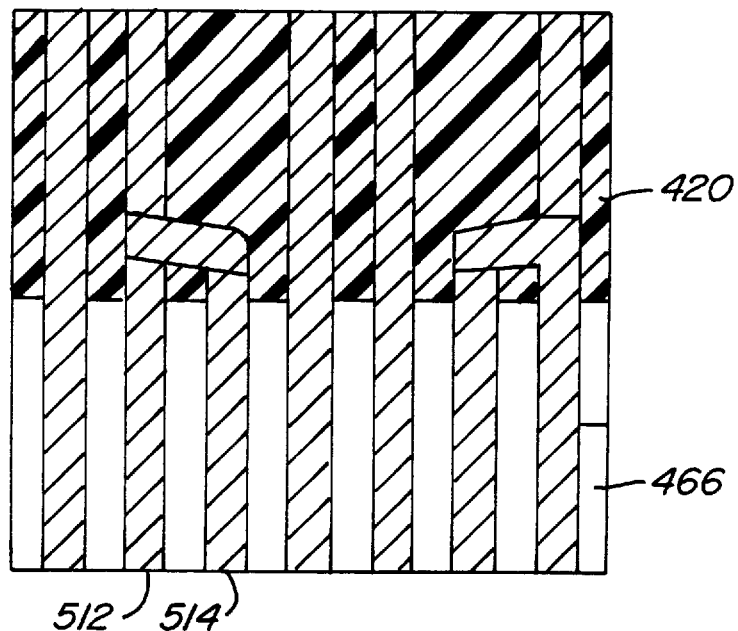
FIGS. 5B and 5C are plan views of the substrate of FIG. 5A.
Figure 5C:
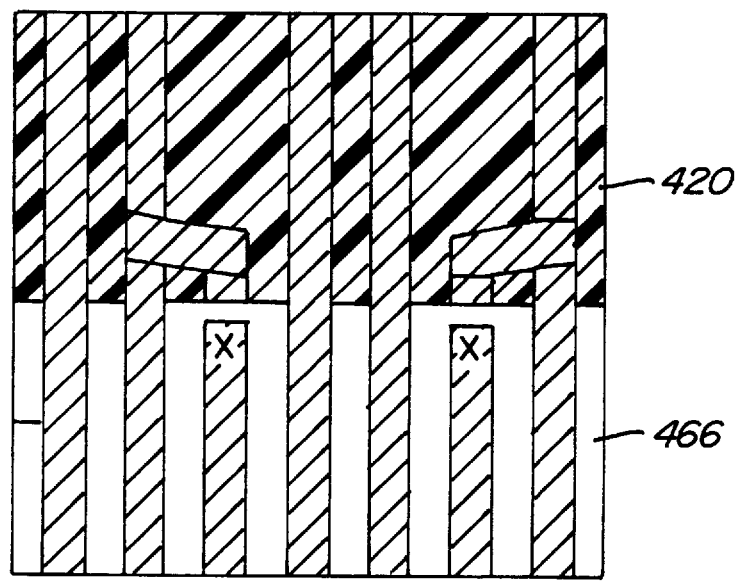

Referring to FIGS. 5A–5C, a reduced circuit density lead design for debus by downbonding is illustrated. Leads 512 and 516 run over the entire surface of the insulating layer 420, whereas leads 514 and 518 do not. Leads 512, 514, 516 and 518 all bridge over the slot 426A. However, the leads 514 and 518 end just after the inner edge 426b of the slot 426A. The inner ends 514i and 518i of leads 514 and 518 are attached to the leads 512 and 516, respectively.

The purpose of attaching leads 514 and 518 to leads 512 and 516 as illustrated is to reduce the number of TAB-tape leads which must be routed through the TAB ball grid array. This embodiment allows reduction of the overall circuit density and improves electrical performance of the semiconductor package. Power and ground leads may be defined for a given semiconductor device in a TAB-tape design having assigned power and ground leads connected to neighboring signal leads. The power and ground leads will be downbonded to the power and ground plans, respectively, whereas the signal leads will not.

As illustrated in FIG. 5A, leads 512 and 516 are signal leads and traverse the entire surface of the insulating layer 420. Leads 514 and 518 are attached to the signal leads 512 and 516, respectively, but do not traverse the surface of the insulating layer 420 any further. Leads 514 are cut at the edge 426b leaving cut ends 514h and 514g. End 514h is left unconnected and end 514g is downbonded to the power layer 440. In similar fashion, lead 518 is cut at the edge 426b and the end 518g downbonded to the ground layer 466.

Not illustrated but similar in application are the inner leads that connect to the die 430 (FIG. 4A). The downbonded leads are cut at the edge 422 and downbonded to either the power inner edge portion 444 or the ground inner edge portion 464. The designated downbonded leads need only extend into the central cavity for connection to the die 430 and may be similarly terminated to neighboring signal leads that traverse the entire surface of the insulating layer 420 before being cut during the downbonding process. In this way, downbonded leads are supported by the insulating layer 420 but need not extend through the ball grid array as do the signal leads. This embodiment reduces the plating of unnecessary power and ground leads and allows the signal leads to be heavier (wider) without increasing manufacturing dimensional tolerances.

ENCAPSULATION OF THE CUT ENDS OF DOWNBONDED LEADS

Figure 6B:
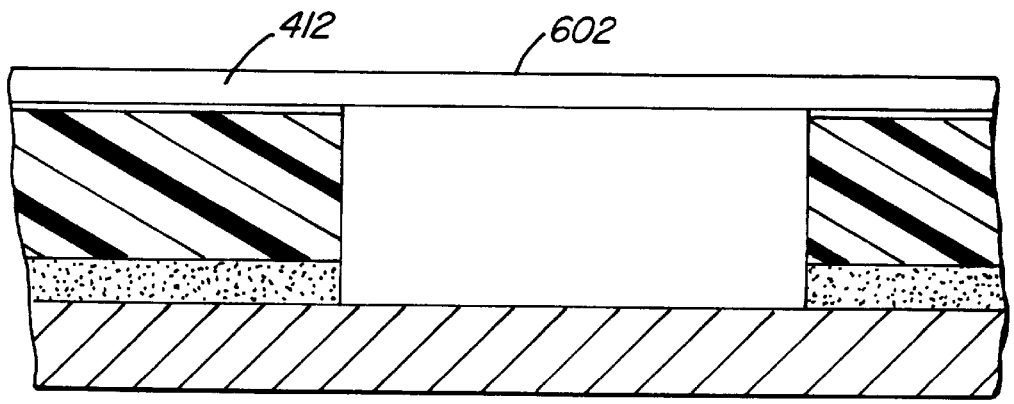
FIGS. 6B and 6C are elevational views of the embodiment of FIG. 6A before and after a lead is cut, respectively.
Figure 6C:
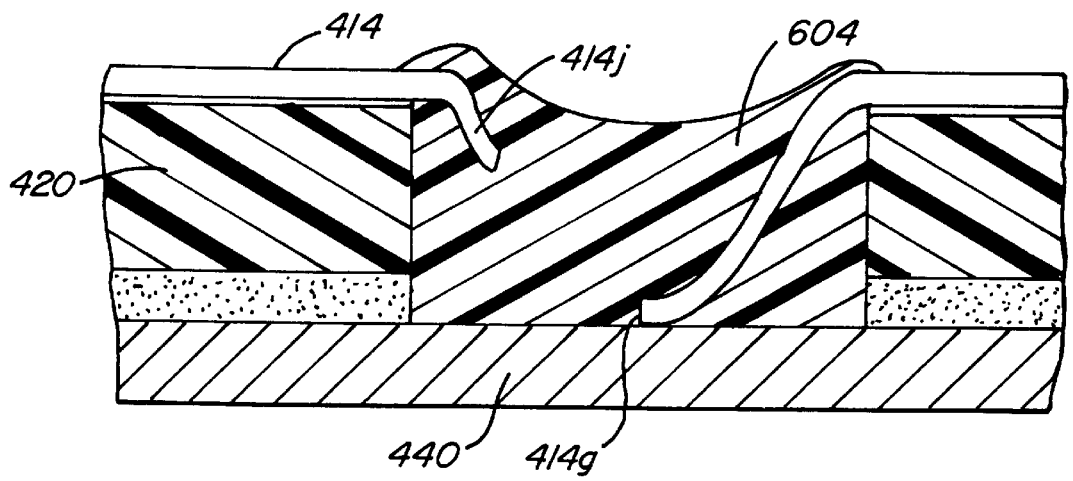

Referring to FIGS. 6A–6C, an embodiment for encapsulation of the cut ends of the downbonded leads is illustrated. Leads 412, 414 and 416 are cut during the downbonding process at point 602. Cutting point 602 is a short distance from the edge 426b, but of sufficient distance to allow short ends 412*j*, 414*j* and 416*j* of the leads 412, 414 and 416, respectively, to be of sufficient length to be bent during the cutting step toward the downbond surface and urged into the elongated slot 426A.

The downbonded ends 412*g*, 414*g* and 416*g* are attached to the power surface (446A) and ground surface (466) as disclosed herein. After bonding the ends 412*g*, 414*g* and 416*g*, encapsulant 604 is placed into the slot 426A and over the ends 412*g*–416*g* and 412*j*–416*j*. Encapsulating the ends 412*j*–416*j* prevents these ends from causing copper migration since these ends are now completely encapsulated and sealed from subsequent processes or contaminates. In addition, the possibility of inadvertently shorting the ends 412*j*–416*j* to each other or other conductive parts of the semiconductor package (signal leads) is greatly reduced. Similarly, the possibility of electrical leakage from the ends 412*j*–416*j* caused by moisture or contaminates in the package is greatly reduced.

THERMOSONIC BONDING TOOL FOR CUTTING AND DOWNBONDING TAB LEADS

As mentioned previously, U.S. Pat. No. 4,842,662 ('662 patent) is primarily directed to a "downset" operation whereby an already free end of a conductor is bumpless-bonded to a die. This technique is suitable for bonding the free ends 312*a*, 314*a* and 316*a* of the conductors 312, 314 and 316, respectively (FIG. 3A) and the free ends 412*a*, 414*a* and 416*a* of the conductors 412, 414 and 416, respectively (FIG. 4A) to a die 330.

Figure 8:
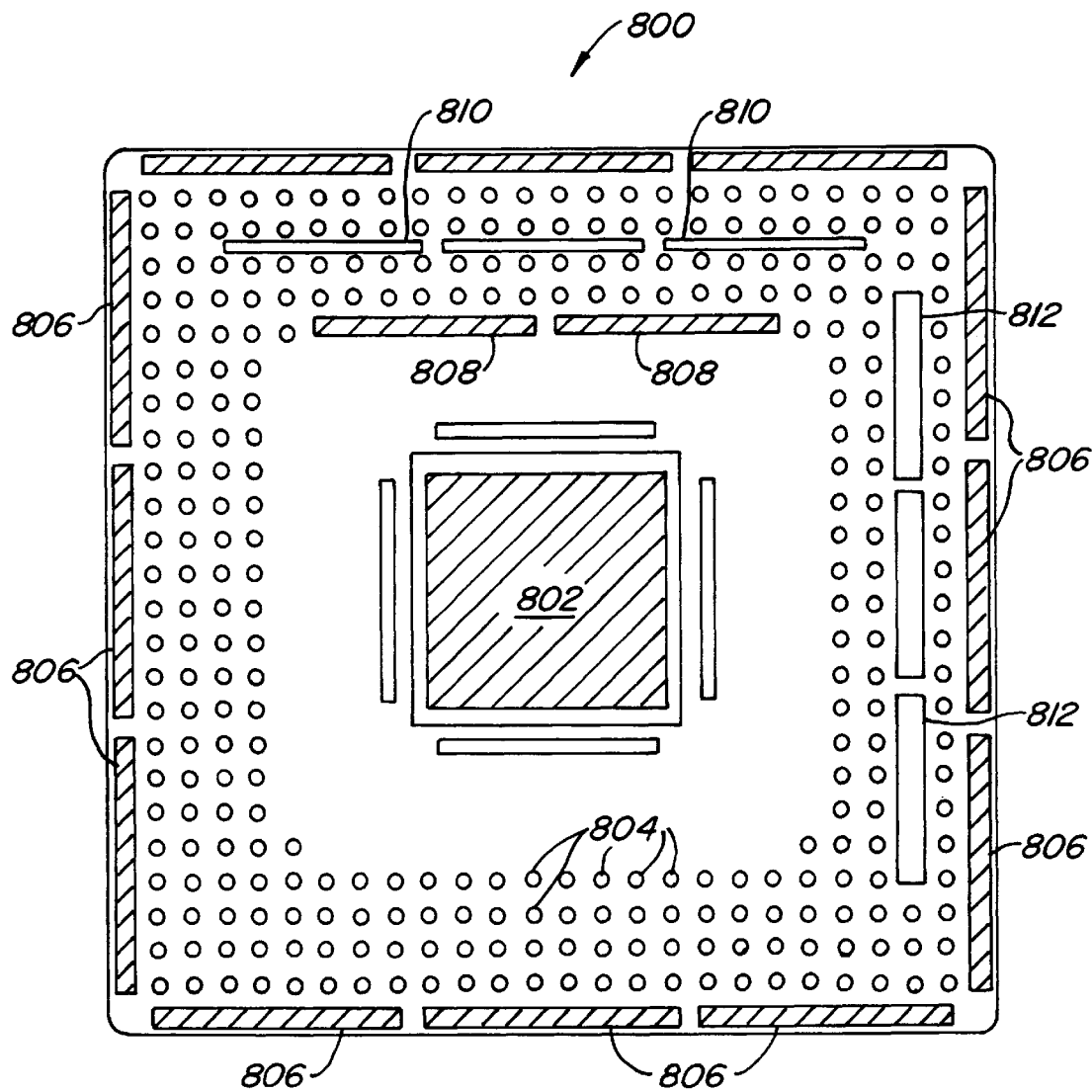
FIG. 8 is a plan view of a semiconductor device package, according to the present invention.

FIG. 5A illustrates a prior art bonding tool 502 having a width "W" larger than the width "w" of the conductor 508 being bonded. A two-headed arrow "L" shows the bonding tool vibrating in the longitudinal axis of the conductor 708, and the coaxial motion "l" (lower case 'el') imparted to the conductor for the stated "wiping". FIG. 8 in the '662 patent illustrates a conductor after bonding, and the raised ridge left by the transverse channel 706 on the conductor 708 (24 in the '662 patent) is evident. This channel 706 would help keep the conductor 708 and the head 704 of the tool 702 moving together as one, longitudinally, to impart the desired wiping action of the conductor against the bond pad (26 in the '662 patent), rather than allowing the tool to vibrate longitudinally with respect to the conductor. In other words, the head 704 of the prior art tool is specifically formed to control longitudinal motion of the conductor.

There is, however, a different and more preferred way to cut and bond the "created" free ends 312*d*, 312*g*, 412*d*, 412*g*, 414*d* and 414*g* to the second and third conductive layers. As mentioned previously, the present method is different from that of the U.S. Pat. No. 4,842,662 patent in that the free ends to be bent towards and bonded to the second and third conductive layers must first be cut. This cutting operation may be done by the sharp edges (322, 326*b*, 422, 426*b*) of the polyimide layer (320, 420).

Figure 7A:
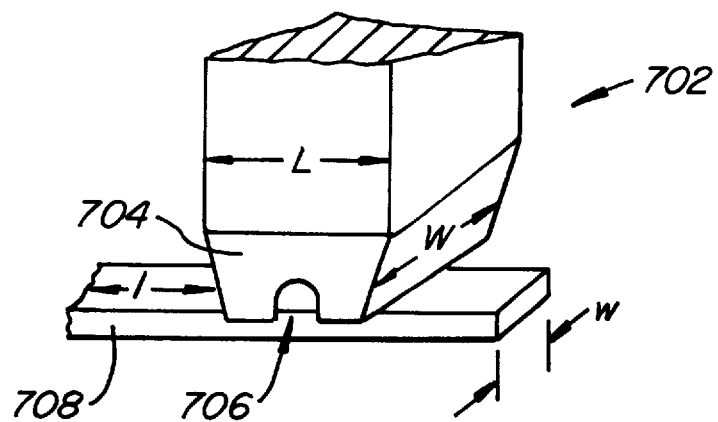
FIG. 7A is a perspective view of a prior art thermo-sonic bonding technique.
Figure 7B:
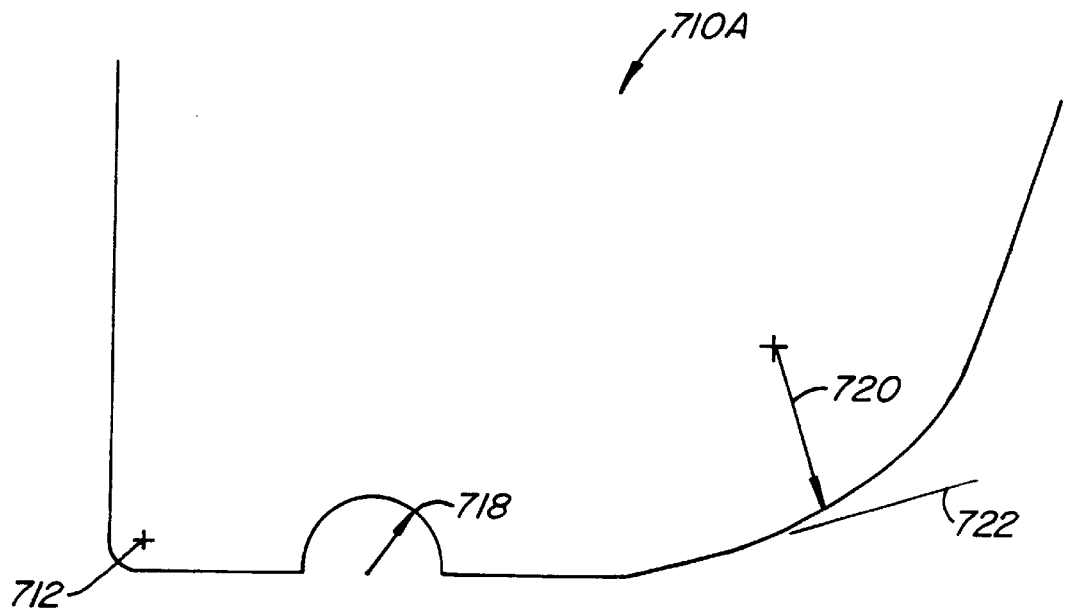
FIGS. 7B and 7C are perspective views of a cutting bonding tools according to the present invention.
Figure 7C:
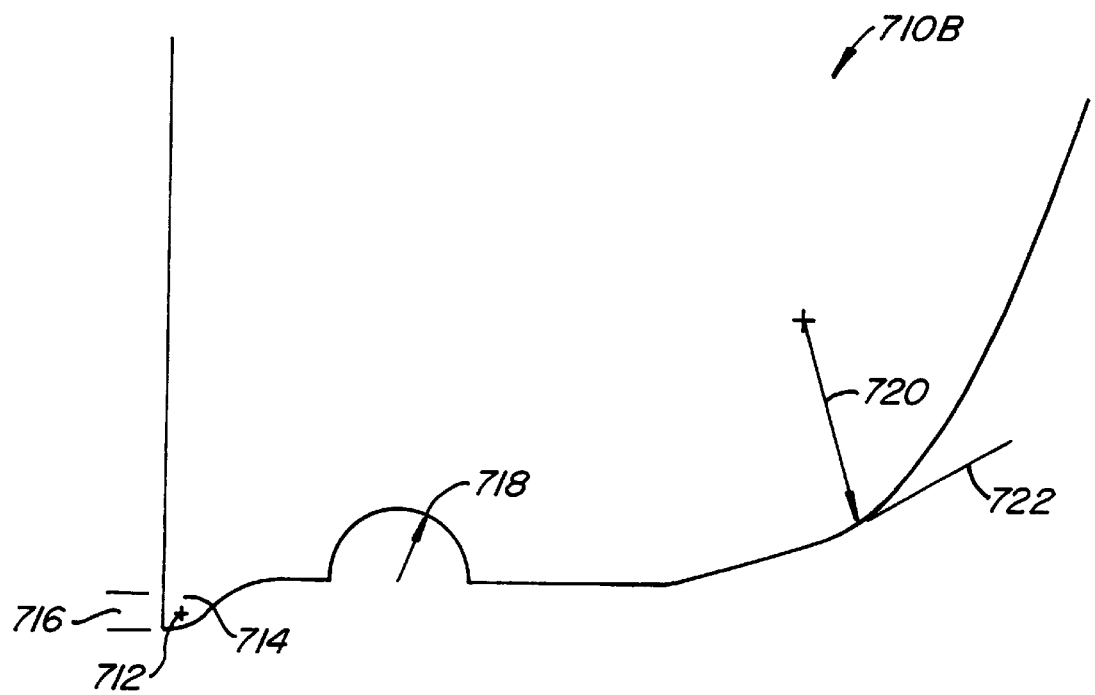

A more effective cutting operation may be obtained when a combination cutting and downbonding tool is utilized. Referring to FIGS. 7B and 7C, cutting/downbonding tools are illustrated in schematic elevational views. The bonding tools 710A and 710B both have sharp front radii 712 to ensure lead breakage at the point of contact. Tool 710B has a cutting point 714 having a cutting tip having a depth 716 which ensures the lead being cut breaks at the point of tool contact.

Once the lead is cut, the tool downsets the cut lead to a surface of either the power or ground layer. The tool then bonds the lead to the conductive layer surface by ultrasonic bonding. The bonding process is improved by the large back radius 720 and chamfer 722 that facilitates the use of high bonding forces and ultrasonic energy. It also ensures a gradual transition during the bonding of the lead to the conductive surface which substantially reduces the possibility of cutting the lead during the bonding process.

DOWNBOND SLOT LOCATIONS FOR FABRICATION OF A TBGA PACKAGE

The outer downbond slots (ground or power plane connections) may be at the perimeter of the TAB or CTHS package body. When the outer downbond slots are placed outside of the ball grid array an increase in the package size is required to accommodate the outer downbond slots, and all circuit traces (leads) must pass through the ball grid array. Having to pass all of the circuit traces through the ball grid array increases circuit density and may reduce the electrical performance of the semiconductor package.

Referring now to FIG. 8, a bottom plan view of a CTHS package is schematically illustrated. A typical CTHS package 800 comprises a TBGA, a semiconductor die 802, solder balls 804, and downbond slots 806. The downbond slots 806 are outside the grid array of the solder balls 804. The slots 806 require that the package 800 size be increased to accommodate the necessary area for the downbond slots 806.

Downbond slots may be placed in different locations in the package 800 in order to reduce the package size. For example, the following locations may be utilized for downbond slots without increasing the size of the package 800: (1) Downbond slots 808 may be placed just inside the innermost row of balls 804, (2) downbond slots 810 may be placed within the array of balls 804 without depopulating the number of ball locations, and (3) downbond slots 812 may be placed within the array of balls 804 with depopulating the number of ball locations.

Placing the downbond slots in any or all of the locations above allows a reduction in the overall package 800 size. It also reduces the number of leads which must pass through the ball grid array to the package perimeter.

CONDUCTIVE LAYER ACTING AS A HEAT SINK AND ENCAPSULANT DAM

As mentioned above, the additional conductive layer (e.g., 340, 460 of FIGS. 3A and 4A, respectively) can be thicker and stiffer than a conventional additional foil layer (e.g., 220 of FIG. 2A). Hence, the additional conductive layer can not only "rigidize" the TAB tape, but it can also act as a heat spreader and encapsulant dam.

Figure 9A:
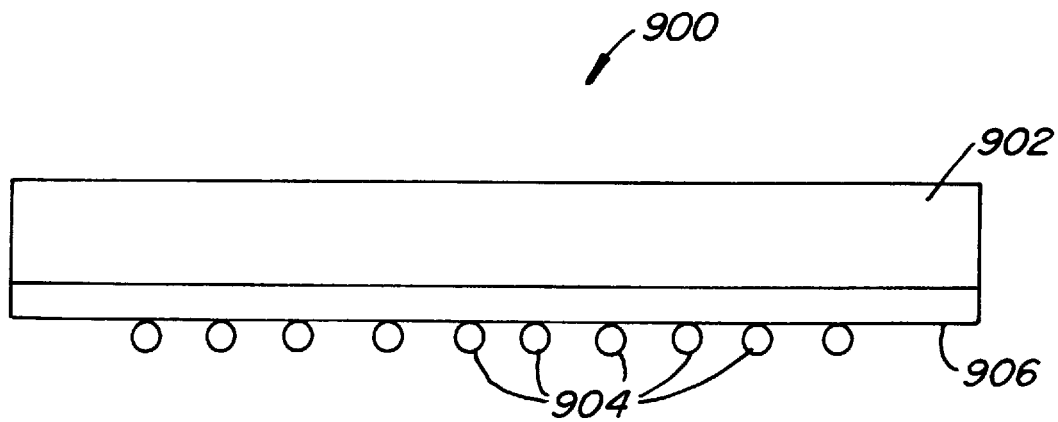
FIG. 9A is an elevational view of a TAB semiconductor package.

FIG. 9A illustrates a schematic elevational view of a CTHS package. The package 900 is comprised of a heat spreader 902 and a TBGA assembly 906. The perimeter area around the solder balls 904 of the package 900 is required for outer downbonding slots (see FIG. 8, slots 806).

Figure 9B:
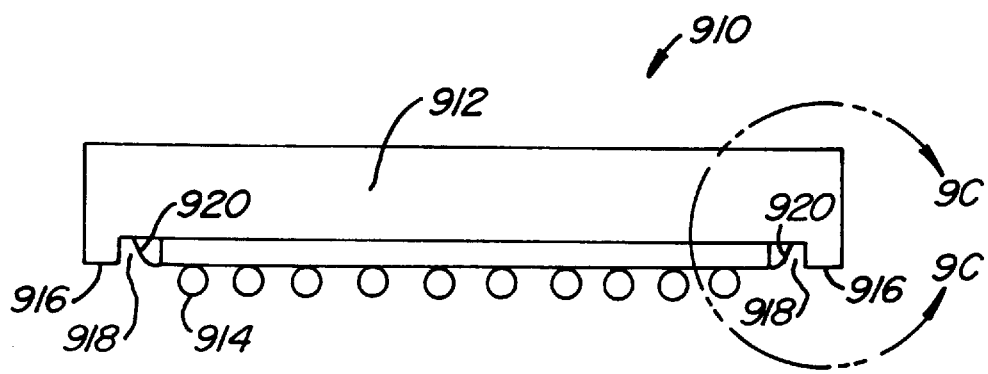
FIG. 9B is an elevational view of a TAB semiconductor package having an integral outer downbond slot and perimeter dam for encapsulant, according to the present invention.
Figure 9C:
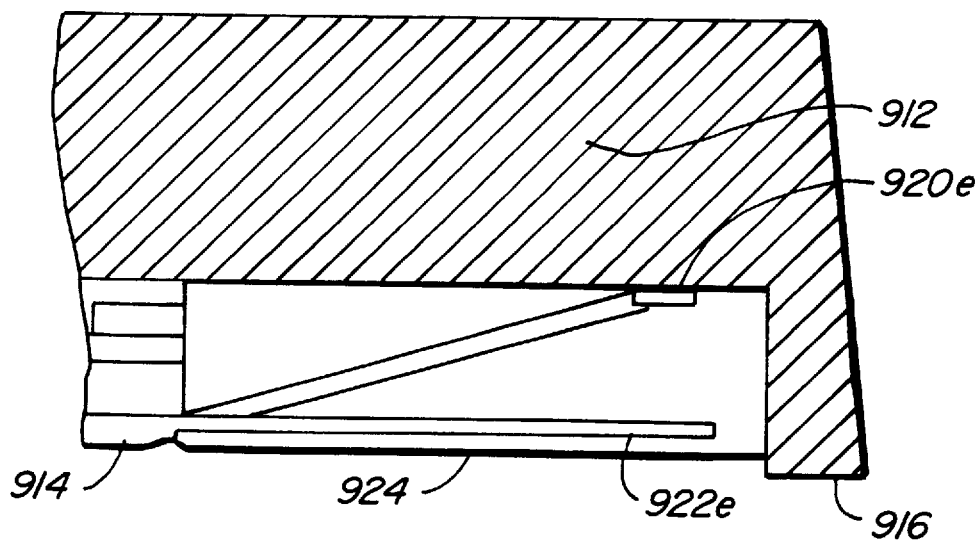
FIG. 9C is a partial expanded elevational view of the package of FIG. 9B.

Referring to FIGS. 9B and 9C, schematic elevational views of an embodiment of the present invention are illustrated. A package 910 is comprised of a lid/heatsink 912 and a TBGA assembly 914. The heatsink 912 further has a ridges 916 and spaces 918 between the ridges 916 and the outer edges of the assembly 914. The TBGA assembly 914 has outer leads 920 that may be bonded to the heatsink 912 as described above.

The ridges 916 may be used as a dam rim when encapsulant 924 is introduced into the spaces 918 after the leads 920*e* have been downbonded to the heatsink 912. Not all of the leads need be downbonded, for example, leads 922e are not connected to the heatsink 912 but are still encapsulated in the encapsulant 924 so as not to short to the heatsink 912, other leads or cause electrical problems as mentioned above.

The ridges 916 may be formed by preferably by stamping during the fabrication of the heatsink 912. The height of the ridges 916 preferably should be greater than the height of the TBGA assembly 914 lamination and the meniscus of the encapsulant 924 it is designed to restrict.

Fabrication of the package 910 may be performed as follows:

(a) Excise the tape-site within the outer edge (326a of FIG. 3A) of the outermost downbond slot (326).

(b) The remaining leads should be trimmed short enough so as to avoid inadvertently shorting the leads not selected for downbonding to the heatsink 912.

(c) Laminate/assemble the required power (440), ground (912) and signal planes together.

(d) Downbond the selected leads (920e) to the heatsink (912) plane.

(e) Fill the downbond space (918) with encapsulant (924).

This embodiment of the present invention thus reduces the package size by omission of the carrier-film and adhesive layers beyond the outermost downbond slot and serves as a dam to contain encapsulant during the package fabrication process.

BALL ATTACH TO TBGA USING SOLDER FLUX AND PHOTOIMAGEABLE SOLDER RESIST DEFINITION

Solder ball attachment to TBGA requires a temperature be applied that is high enough to melt solder to conductor pads on the TBGA-tape. Prior art methods of attaching solder balls to a TBGA-tape is a low throughput process because each ball must be addressed individually. In addition, the known process is restricted to a two-layer tape (chemically milled dielectric) because the required precision alignment of the ball pads and holes is not economically achieved in three-layer tape.

The present invention achieves an inherently higher throughput at lower cost when attaching solder balls to a TBGA-tape. In addition, the method of the present invention allows utilization of less costly three layer TAB tape. Three layer TAB tape may be effectively utilized by application of photoimageable solder resist that controls the wettable area when the solder collapses during reflow heating.

Figure 10A:
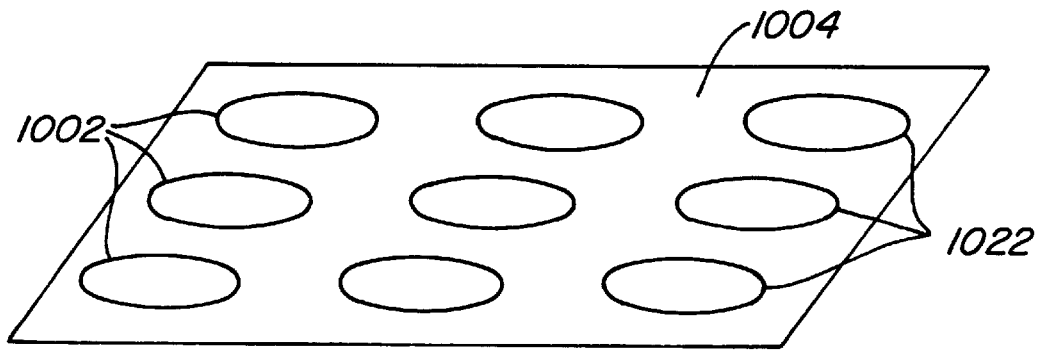
FIGS. 10A—10E are perspective views of the steps in attaching solder balls to a TBGA tape using solder flux and photoimageable solder resist definition, according to the present invention.

Referring now to FIGS. 10A–10E, partial perspective schematic views of the steps in attaching solder balls to a TBGA tape using solder flux and photoimageable solder resist are illustrated. In FIG. 10A, copper pads 1002 are patterned onto a dielectric 1004 (associated circuit traces/leads attached to the pad perimeters and interspersed between the pads are not illustrated for clarity).

Figure 10B:
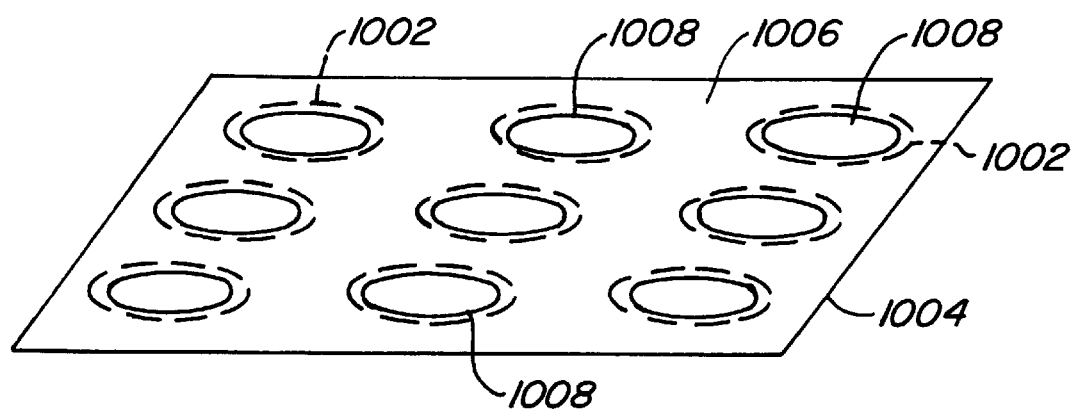

In FIG. 10B, photoimageable solder resist (PSR) is applied to the pads 1002 and dielectric 1004 by spraying, coating, screen printing, or other means known to those skilled in the art. The PSR is photoprinted and developed to reveal access "holes" 1008 to the underlying conductor pads 1002. The access holes 1008 may be smaller, larger or the same size as the underlying conductor pads 1002. After the PSR is applied and patterned, the exposed areas of the access holes 1008 may be plated with solder, nickel, gold, tin or any combination thereof.

Figure 10C:
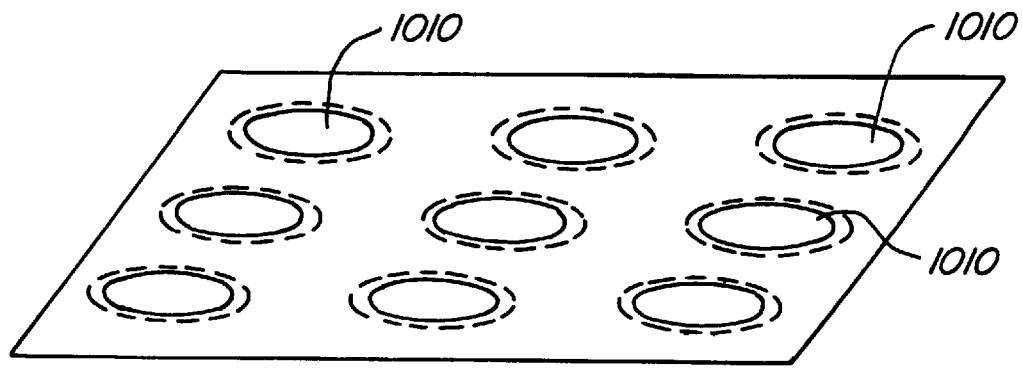
Figure 10D:
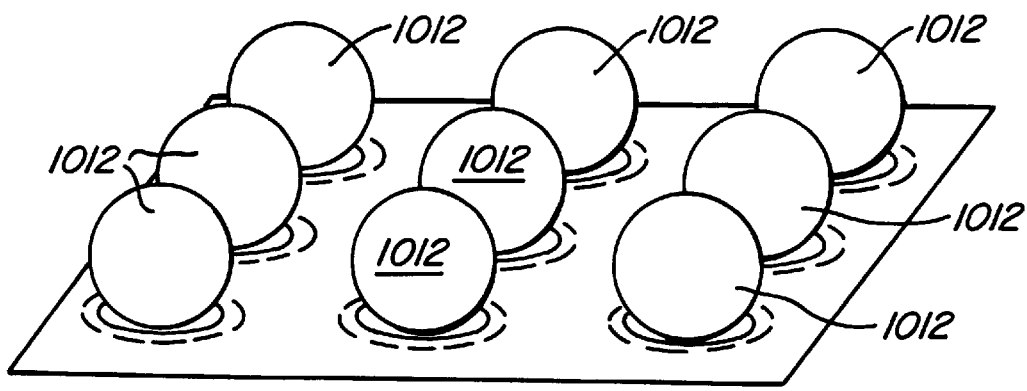

FIG. 10C illustrates solder flux 1010 applied to surfaces of the exposed access holes 1008 for attaching the solder balls 1012 (FIG. 10D). The solder flux 1010 may be used to hold the solder balls 1012 in place. The flux also removes any oxides, tarnish, etc. that may detract from the wettability of exposed underlying metal pad 1002 or the surface of the solder balls 1012 during the solder reflow process.

FIG. 10D illustrates the solder balls 1012 in place on the surface of the pads 1002 and being held thereto by the solder flux 1010. This assembly may be passed through a solder reflow oven which reflows the solder balls 1012 by melting them onto the exposed pads 1002, through the underlying access holes 1008. Heat sufficient to reflow the solder balls may also be supplied by a laser heating system or other solder reflow systems known to those skilled in the art of semiconductor package fabrication.

Figure 10E:
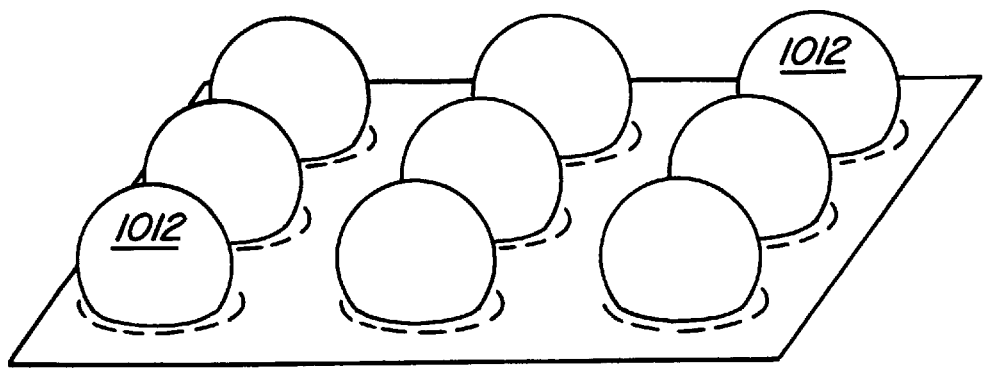

The PSR restricts the solder wettable area to only the solder wettable surfaces directly under the holes 1008. An advantage of the present invention is that the chance of unwanted solder bridges forming between adjacent conductor leads is greatly reduced because these leads are generally no longer exposed to the possibility of wetting by molten solder. FIG. 10E illustrates the solder balls 1012 attached to the pads 1002 after solder reflow. Any remaining solder flux may be removed by aqueous cleaning methods well known to those skilled in the art.

The present invention, therefore, is well adapted to carry out the objects and attain the ends and advantages mentioned, as well as others inherent therein. While presently preferred embodiments of the invention have been given for purposes of disclosure, numerous changes in the details of construction, interconnection and arrangement of parts will readily suggest themselves to those skilled in the art and which are encompassed within the spirit of the invention and the scope of the appended claims.

What is claimed is:

1. A method for attaching collapsible solder balls to a tape ball grid array (TBGA) using solder flux and photoimageable solder resist definition, comprising the steps of:

creating tape automated bonding (TAB) tape solder ball pads in a conductive layer;

applying photoimageable solder resist over the solder ball pads;

developing the applied photoimageable solder resist to create openings in the resist over the underlying pads, thereby exposing only a desired surface in the patterned resist openings;

plating the exposed surfaces of the solder ball pads;

applying solder flux to the plated exposed surfaces of the solder ball pads;

placing solder balls onto the plated exposed surface, wherein the solder flux holds the solder balls in place;

heating the solder balls so as to electro-mechanically connect them to the plated exposed surfaces of the solder pads; and removing any remaining solder flux.

2. The method of claim 1, wherein the step of applying photoimageable solder resist is the step of screen printing the solder resist.

3. The method of claim 1, wherein the step of applying photoimageable solder resist is the step of spraying the solder resist.

4. The method of claim 1, wherein the step of applying photoimageable solder resist is the step of coating the solder resist.

5. The method of claim 1, wherein the step of plating is the step of plating with solder.

6. The method of claim 1, wherein the step of plating is the step of plating with nickel.

7. The method of claim 1, wherein the step of plating is the step of plating with gold.

8. The method of claim 1, wherein the step of plating is the step of plating from the group of nickel and gold.

9. The method of claim 1, wherein the step of plating is the step of plating with tin.

10. The method of claim 1, wherein the step of plating is the step of plating with a solder wettable metal.

11. The method of claim 1, wherein the step of heating the solder balls is the step of heating in a solder reflow oven.

12. The method of claim 1, wherein the step of heating the solder balls is the step of heating with a laser.

* * * * *